(12) United States Patent
Lee et al.

(10) Patent No.: US 9,520,405 B2
(45) Date of Patent: Dec. 13, 2016

(54) SEMICONDUCTOR DEVICE

(71) Applicants: Do-hyun Lee, Gyeonggi-do (KR);
Jae-duk Lee, Gyeonggi-do (KR);
Young-woo Park, Seoul (KR);
Yung-hwan Son, Gyeonggi-do (KR)

(72) Inventors: Do-hyun Lee, Gyeonggi-do (KR);
Jae-duk Lee, Gyeonggi-do (KR);
Young-woo Park, Seoul (KR);
Yung-hwan Son, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 34 days.

(21) Appl. No.: 14/505,180

(22) Filed: Oct. 2, 2014

(65) Prior Publication Data

US 2015/0097222 A1   Apr. 9, 2015

(30) Foreign Application Priority Data

Oct. 8, 2013  (KR) .......................... 10-2013-0120191

(51) Int. Cl.
| | | |
|---|---|---|
| H01L 27/115 | (2006.01) | |
| H01L 29/788 | (2006.01) | |
| H01L 29/792 | (2006.01) | |

(52) U.S. Cl.
CPC ..... *H01L 27/1157* (2013.01); *H01L 27/11524* (2013.01); *H01L 27/11556* (2013.01); *H01L 27/11582* (2013.01); *H01L 29/7889* (2013.01); *H01L 29/7926* (2013.01)

(58) Field of Classification Search
IPC .................................................. H01L 27/1157
See application file for complete search history.

(56) References Cited

U.S. PATENT DOCUMENTS

| | | | |
|---|---|---|---|
| 8,169,826 B2 * | 5/2012 | Hishida | G11C 5/02 257/324 |
| 8,349,689 B2 | 1/2013 | Lee et al. | |
| 2009/0097309 A1 * | 4/2009 | Mizukami | G11C 5/02 365/184 |
| 2010/0238732 A1 * | 9/2010 | Hishida | G11C 16/0483 365/185.17 |
| 2010/0244119 A1 | 9/2010 | Fukuzumi et al. | |
| 2011/0090737 A1 | 4/2011 | Yoo et al. | |
| 2011/0199833 A1 * | 8/2011 | Shim | G11C 16/0483 365/185.23 |

(Continued)

FOREIGN PATENT DOCUMENTS

| | | |
|---|---|---|
| KR | 1020100093350 | 8/2010 |
| WO | 2013/141968 | 9/2013 |

*Primary Examiner* — Eugene Lee
(74) *Attorney, Agent, or Firm* — F. Chau & Associates, LLC

(57) ABSTRACT

A semiconductor device is provided. A channel layer is formed on a substrate. The channel layer is extended in a first direction substantially perpendicular to an upper surface of the substrate. A ground selection line is formed on a first region of the channel layer. A plurality of word lines is formed on a second region of the channel layer. A plurality of string selection lines is formed on a third region of the channel layer. The second region of the channel layer includes a first conductivity type dopant. The first, second and third regions of the channel layer are disposed along the first direction.

14 Claims, 16 Drawing Sheets

(56) References Cited

U.S. PATENT DOCUMENTS

| | | | |
|---|---|---|---|
| 2011/0310670 A1* | 12/2011 | Shim | G11C 16/0408 365/185.17 |
| 2012/0032245 A1* | 2/2012 | Hwang | H01L 27/11551 257/314 |
| 2012/0064682 A1* | 3/2012 | Jang | H01L 21/28273 438/268 |
| 2012/0119287 A1* | 5/2012 | Park | H01L 27/11519 257/329 |
| 2012/0126308 A1 | 5/2012 | Kim et al. | |
| 2012/0139027 A1* | 6/2012 | Son | H01L 29/7926 257/324 |
| 2012/0153291 A1* | 6/2012 | Kim | H01L 27/11582 257/66 |
| 2012/0153372 A1* | 6/2012 | Kim | H01L 27/11556 257/314 |
| 2012/0201080 A1* | 8/2012 | Kang | G11C 16/0483 365/185.11 |
| 2012/0228697 A1* | 9/2012 | Youm | H01L 29/7926 257/329 |

* cited by examiner

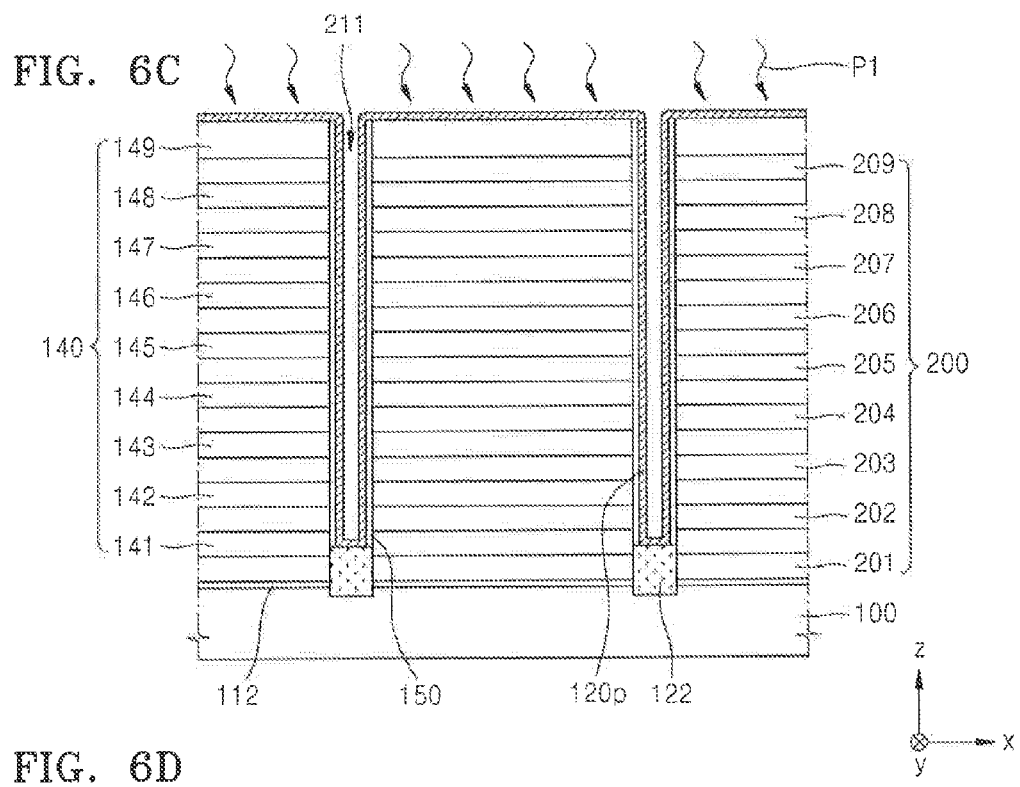
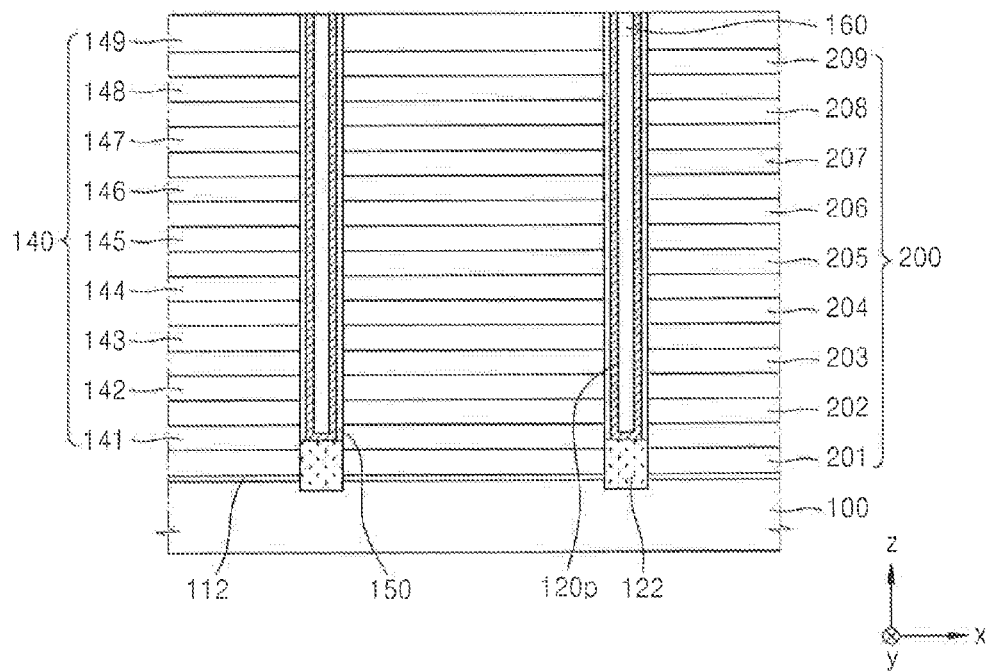

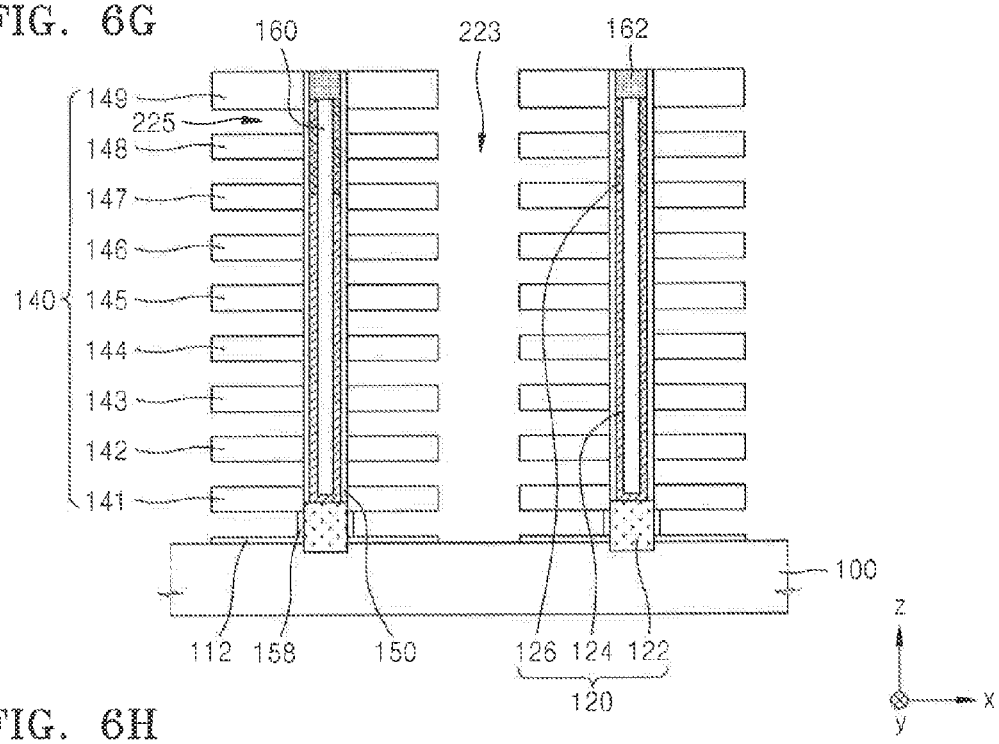
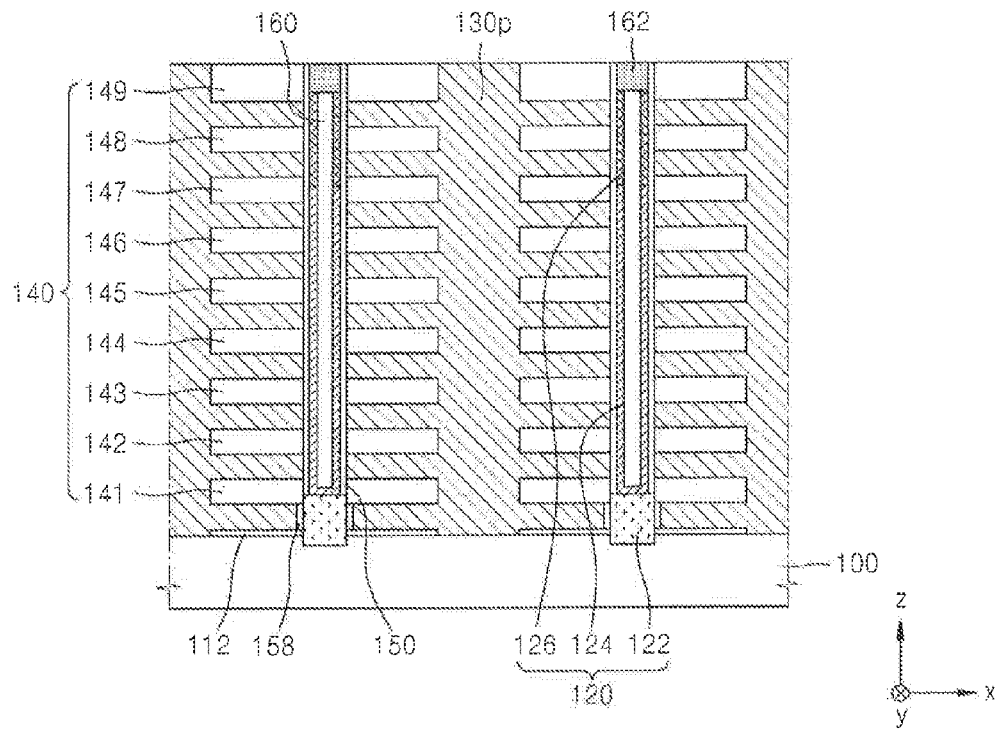

SEMICONDUCTOR DEVICE

CROSS-REFERENCE TO RELATED APPLICATION

This application claims priority under 35 U.S.C. §119 to Korean Patent Application No. 10-2013-0120191, filed on Oct. 8, 2013 in the Korean Intellectual Property Office, the disclosure of which is incorporated by reference herein in its entirety.

TECHNICAL FIELD

The inventive concept relates to a semiconductor device, and more particularly, to a semiconductor device having a vertical structure.

DISCUSSION OF RELATED ART

As the integration density of memory devices increases, memory devices having a vertical transistor structure have been proposed.

SUMMARY

According to an exemplary embodiment of the present inventive concept, a semiconductor device is provided. A channel layer is formed on a substrate. The channel layer is extended in a first direction substantially perpendicular to an upper surface of the substrate. A ground selection line is formed on a first region of the channel layer. A plurality of word lines is formed on a second region of the channel layer. A plurality of string selection lines is formed on a third region of the channel layer. The second region of the channel layer includes a first conductivity type dopant. The first, second and third regions of the channel layer are disposed along the first direction.

According to an exemplary embodiment of the present inventive concept, a semiconductor device is provided. A ground selection transistor is stacked on a substrate. A plurality of memory cell transistors is stacked on the ground selection transistor. The plurality of memory cell transistors is stacked on each other in a first direction. The first direction is substantially perpendicular to the substrate. A lowermost memory cell transistor of the plurality of memory cell transistors is stacked on the ground selection transistor. The plurality of memory cell transistors includes a first channel layer doped with a first impurity type dopant and extended in the first direction. A string selection transistor is stacked on an uppermost memory cell transistor of the plurality of memory cell transistors. A drain electrode is stacked on the string selection transistor in the first direction. A source electrode is formed on the substrate. The source electrode is spaced apart from the plurality of memory cell transistors in a second direction substantially perpendicular to the first direction.

According to an exemplary embodiment of the present inventive concept, a method of manufacturing a semiconductor device is provided. A layered structure is formed on a substrate. The layered structure includes a plurality of insulating layers and a plurality of sacrificial layers alternately stacked on each other. A first hole is formed to penetrate the layered structure in a first direction. The first hole exposes the substrate. A first gate insulating film is formed on an inner sidewall of the first hole. A preliminary channel layer is formed on the first gate insulating film. A doping process is performed on the preliminary channel layer. A second hole is formed to penetrate the layered structure in the first direction. The second hole is spaced apart from the first hole in a second direction substantially perpendicular to the first direction. The second hole exposes the plurality of insulating layers and the plurality of sacrificial layers. The plurality of exposed insulating layers of the layered structure is removed through the second hole. A conductive material is formed between two adjacent insulating layers of the plurality of insulating layers exposed by the second opening.

BRIEF DESCRIPTION OF THE DRAWINGS

These and other features of the inventive concept will become more apparent by describing in detail exemplary embodiments thereof with reference to the accompanying drawings of which:

FIGS. 6A through 6J are cross-sectional views showing a method of manufacturing the semiconductor device according to an exemplary embodiment of the present inventive concept;

DETAILED DESCRIPTION OF EXEMPLARY EMBODIMENTS

Figure 1:
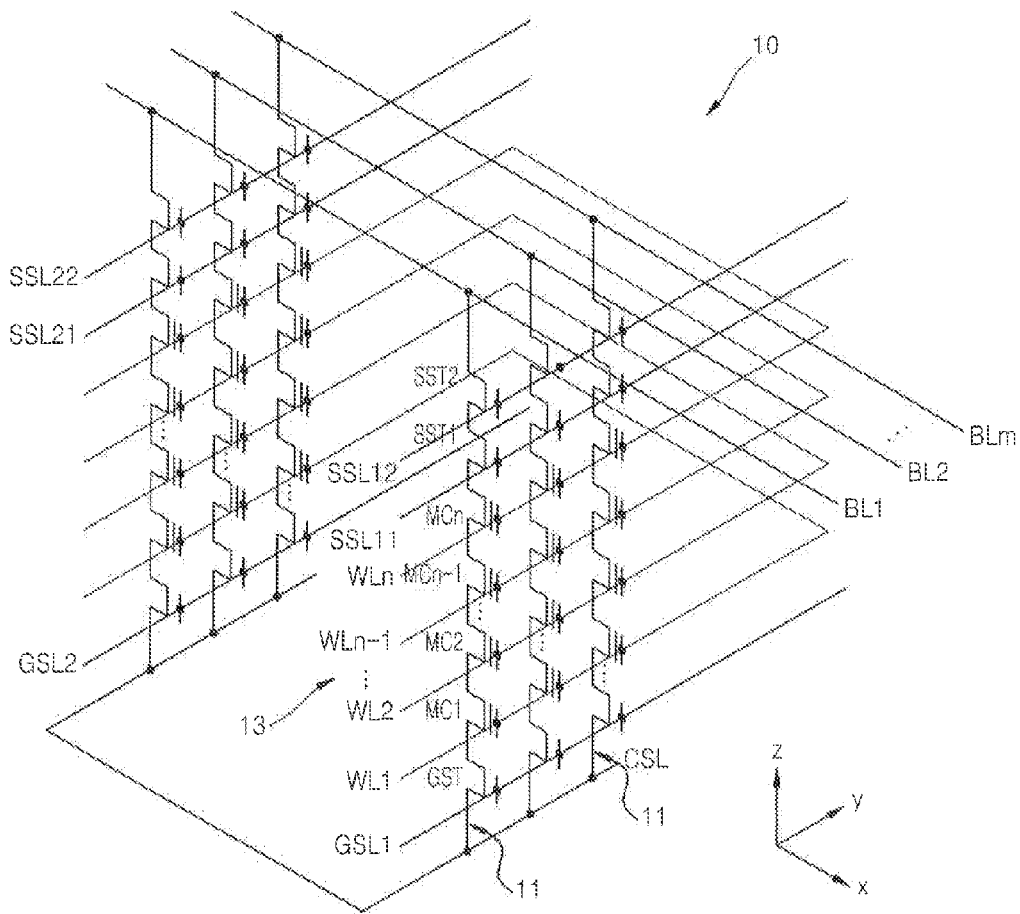
FIG. 1 is a circuit diagram of a memory cell array of a semiconductor device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a circuit diagram of a memory cell array 10 of a semiconductor device, according to an exemplary embodiment of the present inventive concept. The semiconductor device includes a vertical NAND flash memory device having a vertical channel structure.

Referring to FIG. 1, the memory cell array 10 includes a plurality of memory cell strings 11. The memory cell array 10 includes a plurality of bit lines BL1, BL2, . . . , BLm−1, and BLm, a plurality of word lines WL1, WL2, . . . , WLn−1, and WLn, a plurality of string selection lines SSL11, SSL12, SSL21, and SSL22, a plurality of ground selection lines GSL1 and GSL2, and a common source line CSL. The memory cell strings 11 are formed between the bit lines BL1, BL2, . . . , BLm−1, and BLm and the common source line CSL. A memory cell block 13 includes the memory cell strings 11.

Each of the memory cell strings 11 includes string selection transistors SST1 and SST2, a ground selection transistor GST, and a plurality of memory cell transistors MC1, MC2, . . . , MCn−1, and MCn. Drain regions of the string selection transistors SST1 and SST2 are connected to the bit lines BL1, BL2, . . . , BLm−1, and BLm. Source regions of the ground selection transistors GST are connected to the common source line CSL. The common source line CSL is commonly connected to the source regions of the ground selection transistors GST.

The string selection transistors SST1 and SST2 are connected to the string selection lines SSL11, SSL12, SSL21, and SSL22, and the ground selection transistors GST are connected to the ground selection lines GSL1 and GSL2. Also, the memory cell transistors MC1, MC2, . . . , MCn−1, and MCn are respectively connected to the word lines WL1, WL2, . . . , WLn−1, and WLn.

The memory cell array 10 is arranged in a three-dimensional structure. The memory cell transistors MC1, MC2, . . . , MCn−1, and MCn of the memory cell strings 11 are connected in a series to each other along a z-axis, which is perpendicular to an x-y plane that is parallel to an upper surface of a substrate (not shown). Accordingly, channel regions of the string selection transistors SST1 and SST2, the ground selection transistors GST, and the memory cell transistors MC1, MC2, . . . , MCn−1, and MCn are formed substantially perpendicular to the x-y plane.

Figure 2A:
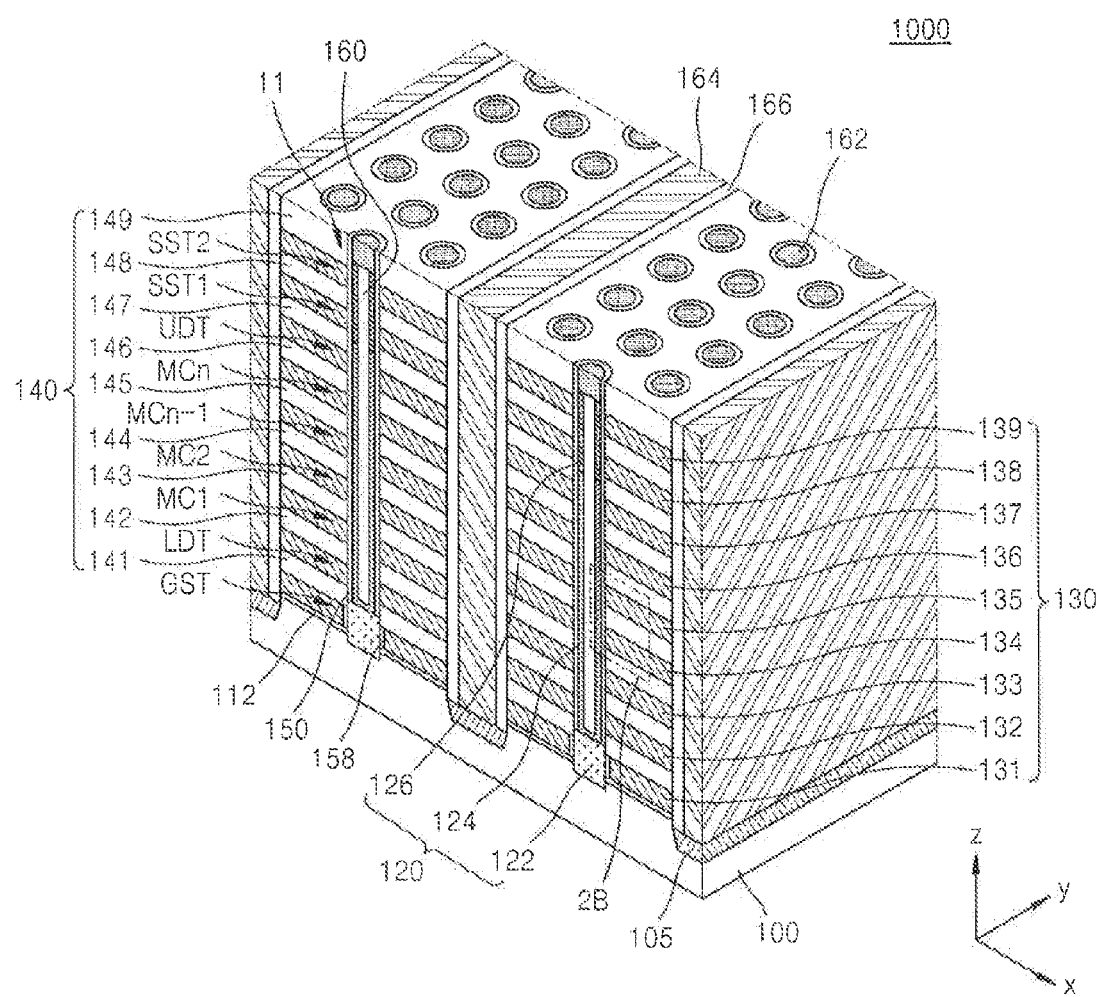
FIG. 2A is a perspective view of a semiconductor device according to an exemplary embodiment of the present inventive concept.
Figure 2B:
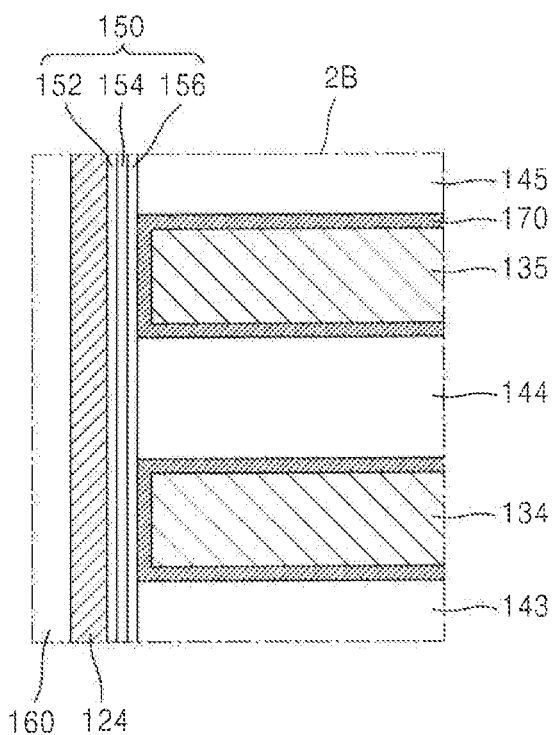
FIG. 2B is an enlarged cross-sectional view of portion 2B of FIG. 2A.

FIG. 2A is a perspective view of a semiconductor device 1000 according to an exemplary embodiment of the present inventive concept, and FIG. 2B is an enlarged cross-sectional view of a portion 2B of FIG. 2A. Some constituent elements, for example, bit lines, are omitted for the convenience of a description.

Referring to FIGS. 2A and 2B, the semiconductor device 1000 includes a plurality of memory cell strings 11 formed on a substrate 100. Each of the memory cell strings 11 includes a channel layer 120 that extends in a vertical direction on the substrate 100, a ground selection transistor GST, a plurality of memory cell transistors MC1, MC2, . . . , MCn−1, and MCn, and first and second string selection transistors SST1 and SST2, which are disposed along a sidewall of the channel layer 120. A lower dummy transistor LOT is formed between the ground selection transistor GST and the lowermost memory cell transistor MC1, and an upper dummy transistor UDT is formed between the uppermost memory cell transistor MCn and the first string selection transistors SST1.

The substrate 100 has a top surface that extends in an x-direction and a y-direction. The substrate 100 may include a silicon substrate, a germanium substrate, a silicon-germanium substrate, a silicon-on-insulator (SOI) substrate, or a germanium-on-insulator (GeOI) substrate. Although not shown, a p-well (not shown) may be formed in the substrate 100.

A common source region 105 extends in the y-direction and is formed on an upper portion of the substrate 100. The common source region 105 may be a highly doped region with an n-type dopant. For example, the common source region 105 may be formed in the p-well region of the substrate 100 and thus may form a p-n junction diode. The common source region 105 may function as a source region that supplies charge carriers to the memory cell strings 11.

The channel layer 120 extends in the z-direction that is perpendicular to the x and y directions on the upper surface of the substrate 100 between the adjacent common source regions 105. The channel layer 120 is separately disposed in the x-direction and the y-direction, and also, may be disposed in a zig-zag form in the x-direction. For example, the channel layers 120 arranged in the x-direction may be spaced apart from each other in the y-direction.

The channel layer 120 includes a channel contact region 122, a lower channel region 124, and an upper channel region 126.

The channel contact region 122 is electrically connected to the substrate 100 by directly contacting a lower surface of the channel contact region 122 to the substrate 100. The channel contact region 122 may serve as a body-contact that increases a cell current of the memory cell strings 11 by reducing a resistance of the channel layer 120. The channel contact region 122 may be a silicon layer formed from the substrate 100 by using a selective epitaxial growth (SEG) method. The channel contact region 122 may include a p-type dopant. The p-type dopant included in the channel contact region 122 may have a concentration in a range from about 5E16 atoms/$cm^3$ to about 1E19 atoms/$cm^3$.

The lower channel region 124 extends in the z-direction on the channel contact region 122. The lower channel region 124 has a cylindrical shape whose bottom end is closed, or a cup shape. The lower channel region 124 may include polysilicon doped with an n-type dopant. For example, the n-type dopant may include phosphorus (P), arsenic (As), or antimony (Sb), and the concentration of the n-type dopant may be in a range from about 5E16 atoms/$cm^3$ to about 1E19 atoms/$cm^3$. The lower channel region 124 may have a uniform n-type dopant concentration along the z-direction.

The upper channel region 126 extends in the z-direction on the channel contact region 122. A sidewall of the upper channel region 126 may be aligned with a sidewall of the lower channel region 124. The upper channel region 126 may include polysilicon doped with a p-type dopant. For example, the p-type dopant may include aluminum (Al), boron (B), indium (In), or potassium (K), and the concentration of the p-type dopant may be in a range from about 5E16 atoms/$cm^3$ to about 1E19 atoms/$cm^3$.

Gate electrodes 130 may be separately arranged in the z-direction along a sidewall of the channel layer 120. The gate electrodes 130 include first through ninth gate electrodes 131 through 139 that are sequentially arranged in the z-direction from an upper side of the substrate 100. The gate electrodes 130 may be commonly connected to the adjacent memory cell strings 11 that are arranged in the y-direction. The gate electrodes 130 may include tungsten, cobalt, nickel, tantalum, tungsten nitride, tungsten silicide, cobalt silicide, nickel silicide, or tantalum silicide.

The first gate electrode 131 corresponds to the ground selection lines GSL1 and GSL2 of FIG. 1. The second gate electrode 132 corresponds to a lower dummy word line (not shown) that constitutes a lower dummy transistor LDT. The third through sixth gate electrodes 133, 134, 135, and 136 respectively correspond to the word lines WL1, WL2, . . . , WLn−1, and WLn of FIG. 1. In FIG. 2A, four word lines are depicted for convenience of explanation. However, the number of word lines is not limited thereto, and may be various. The seventh gate electrode 137 may correspond to an upper dummy word line (not shown) that constitutes an upper dummy transistor UDT. The eighth gate electrode 138 corresponds to the first string selection lines SSL21 and SSL11, and the ninth gate electrode 139 corresponds to the second string selection lines SSL22 and SSL12.

A lower insulating layer 112 may be interposed between the first gate electrode 131 and the substrate 100. The lower insulating layer 112 may include silicon oxide, silicon nitride, or silicon oxynitride.

Insulating layers 140 are interposed between the adjacent gate electrodes 130. For example, a first insulating layer 141 is formed between the first and second gate electrodes 131 and 132, and a second insulating layer 142 is formed between the second and third gate electrodes 132 and 133. A ninth insulating layer 149 is formed on the uppermost gate electrode 130, for example, the ninth gate electrode 139. A thickness of each of the insulating layers 140 may vary according to gaps between the gate electrodes 130. For example, the first insulating layer 141 between the first and second gate electrodes 131 and 132 may be thicker than other insulating layers, for example, the second to ninth insulating layers 142 through 149, and thus, a sufficient gap may be secured between the ground selection lines GSL1 and GSL2 and the lower dummy word line.

First and second gate insulating films 150 and 158 are formed between the channel layer 120 and the gate electrodes 130.

The first gate insulating film 150 covers sidewalls of the lower channel region 124 and the upper channel region 126. The first gate insulating film 150 may include a tunnel insulating film 152, a charge storing film 154, and a blocking insulating film 156 which are sequentially stacked on the lower and upper channel regions 124 and 126. Charges may tunnel through the tunnel insulating film 152 towards the charge storing film 154 by Fowler-Nordheim (F-N) tunneling. The tunnel insulating film 152 may include, for example, silicon oxide. The charge storing film 154 may be a charge trap layer or a floating gate conductive film. For example, the charge storing film 154 may include silicon nitride, quantum dots, or nanocrystals. The blocking insulating film 156 may include a dielectric material having a dielectric constant greater than that of silicon oxide.

The second gate insulating film 158 may be interposed between the channel contact region 122 and the first gate electrode 131. In the current embodiments, the second gate insulating film 158 may include silicon oxide formed by a thermal oxidation process.

A buried insulating layer 160 is formed to fill the inside of the channel layer 120. The buried insulating layer 160 is formed on inner walls of the lower channel region 124 and the upper channel region 126, and an upper surface of the buried insulating layer 160 is substantially coplanar with that of the upper channel region 126. The buried insulating layer 160 may include silicon oxide.

A drain region 162 is formed on the upper channel region 126 and the buried insulating layer 160. An upper surface of the drain region 162 is substantially coplanar with that of the uppermost insulating layer, for example, the ninth insulating layer 149. Although not shown, an etch-stop film (not shown) may further be formed on the ninth insulating layer 149. In this case, an upper surface of the drain region 162 may be substantially coplanar with an upper surface of the etch-stop film. The drain region 162 may include polysilicon doped with an n-type dopant. The concentration of the n-type dopant may be in a range from about 1E18 atoms/cm$^3$ to about 5E21 atoms/cm$^3$.

A common source line 164 is formed on the common source region 105 of the substrate 100. For example, the common source line 164 is formed on the entire common source region 105 extended along the y-direction. Alternatively, the common source line 164 may be formed on a portion of the common source region 105 extended along the y-direction.

Spacers 166 that include an insulating material may be formed on sidewalls of the common source line 164. The spacers 166 may serve to electrically isolate the common source line 164 from the gate electrodes 130.

A diffusion barrier layer 170 is formed between the gate electrodes 130 and the insulating layers 140 and between the gate electrodes 130 and the first gate insulating film 150. For example, the diffusion barrier layer 170 may include tungsten nitride, tantalum nitride, or titanium nitride.

The first gate electrode 131, the channel contact region 122, and the second gate insulating film 158 constitute the ground selection transistor GST. The third through sixth gate electrodes 133, 134, 135, and 136, the lower channel region 124 adjacent to the third through sixth gate electrodes 133, 134, 135, and 136, and a portion of the first gate insulating film 150 constitute the memory cell transistors MC1, MC2, . . . , MCn−1, and MCn. The eighth and ninth gate electrodes 138 and 139, the upper channel region 126 adjacent to the eighth and ninth gate electrodes 138 and 139, and a portion of the first gate insulating film 150 constitute the first and second string selection transistors SST1 and SST2.

The second and seventh gate electrodes 132 and 137 and portions of the lower channel region 124 and the first gate insulating film 150 adjacent to the second and seventh gate electrodes 132 and 137 respectively constitute the lower dummy transistor LDT and the upper dummy transistor UDT. For example, the lower dummy transistor LDT is formed between the ground selection transistor GST and the lowermost memory cell transistor MC1 to prevent inter-cell interference that may occur when a gap between the ground selection transistor GST and the memory cell transistor MC1 is small. A single lower dummy transistor LDT and a single upper dummy transistor UDT are respectively formed. The inventive concept is not limited thereto. For example, the number of lower dummy transistors LDT and upper dummy transistors UDT may be at least two or more according to the gap sizes between the memory cell transistors MC1, MC2, . . . , MCn−1, and MCn and/or according to the number of memory cell transistors MC1, MC2, . . . , MCn−1, and MCn.

Figure 3:
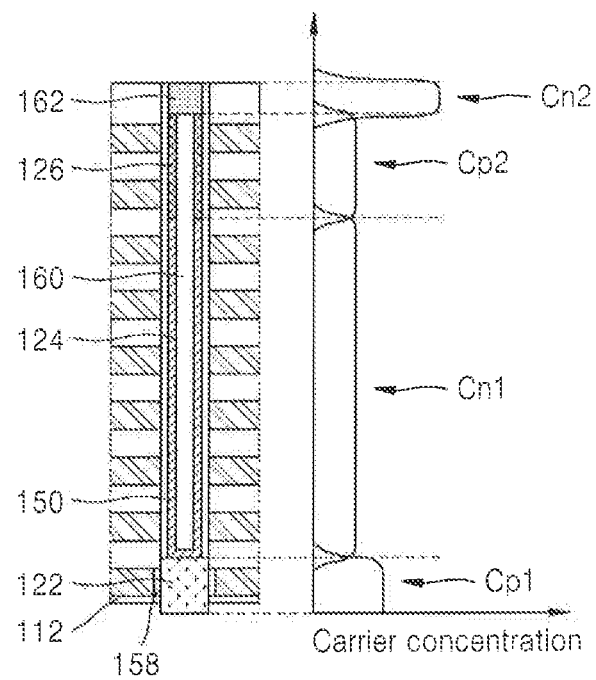
FIG. 3 is a schematic drawing showing a carrier concentration of the channel layer in FIG. 2A.

FIG. 3 is a drawing showing a carrier concentration of the channel layer 120 in FIG. 2A. In FIG. 3, carrier concentrations of the channel contact region 122, the lower channel region 124, the upper channel region 126, and the drain region 162 which are vertically formed on an upper surface of the substrate 100 (see FIG. 2A) are schematically shown.

Referring to both FIG. 3 and FIG. 2A, the channel contact region 122 includes a p-type dopant, and may have a first p-type carrier concentration Cp1. The concentration of the p-type dopant included in the channel contact region 122 may be in a range from about 5E16 atoms/cm$^3$ to about 1E19 atoms/cm$^3$, and the first p-type carrier concentration Cp1 may vary according to the concentration of the p-type dopant. For example, a carrier concentration of an inside of a semiconductor layer may vary according to the concentration of the dopant with which the semiconductor layer is doped, the type of dopant, the degree of defects in the semiconductor layer, and a temperature of the semiconductor layer. The carrier concentrations depicted in FIG. 3 are exemplary, and the relative magnitude of the carrier concentrations may be changed.

The lower channel region 124 includes an n-type dopant, and has a first n-type carrier concentration Cn1. The first n-type carrier concentration Cn1 may be relatively uniform with respect to the entire height of the lower channel region 124 extended along the z-direction. For example, the concentration of an n-type dopant in the lower channel region 124 may be in a range from about 5E16 atoms/cm$^3$ to about 1E19 atoms/cm$^3$. Accordingly, the lower channel region 124 may have a uniform first n-type carrier concentration Cn1.

For example, when the lower channel region 124 includes an n-type dopant, such as phosphorous P, the n-type dopant donates electrons into the lower channel region 124, and thus, the carrier concentration in the lower channel region 124 may be increased. Accordingly, a cell current of the memory cell strings 11 may be increased. For example, as the integration density of a semiconductor device increases, the number of gate electrodes 130 stacked in the vertical direction is increased, and thus, a cell current reduction of the memory cell strings 11 may be prevented.

The n-type dopant remains as a cation (for example, P$^+$) of the n-type dopant in the lower channel region 124 after donating an electron. The cation of the n-type dopant may reduce a potential barrier of a grain boundary in the lower channel region 124, and thus, may increase a carrier mobility of electrons that pass through the grain boundary. Accordingly, a cell current of the memory cell strings 11 may be increased as a result of the increase in the carrier mobility in the lower channel region 124. A detailed description with regards to the variation of carrier mobility due to the addition of the n-type dopant will be described below with reference to FIG. 9.

The n-type dopant doped in the lower channel region 124 may also serve to prevent a turn-on failure of the memory cell transistors MC1 to MCn. For example, the repeated programming and erasing operations of a memory cell transistor may cause electrons to be trapped in the lower channel region 124 that is adjacent to an edge portion of the gate electrodes 130. Such trapped electrons may in turn prevent the memory cell transistors MC1 to MCn from turning on. For example, the trapped electrons at both sides of a channel of the memory cell transistor MC1 to MCn may prevent an inversion layer from being formed between the source and drain regions, and thus, a turn-on failure of the memory cell transistor may occur. However, when the lower channel region 124 includes an n-type dopant, a parasitic resistance due to the trapped electrons may be reduced, and a turn-on failure may be prevented.

The upper channel region 126 includes a p-type dopant, and has a second p-type carrier concentration Cp2. The concentration of the p-type dopant in the upper channel region 126 may be in a range from about 5E16 atoms/cm$^3$ to about 1E19 atoms/cm$^3$, and the upper channel region 126 has a uniform second p-type carrier concentration Cp2 on the entire region thereof. The drain region 162 includes an n-type dopant, and has a second n-type carrier concentration Cn2. The concentration of the n-type dopant in the drain region 162 may be in a range from about 1E18 atoms/cm$^3$ to about 5E21 atoms/cm$^3$, and accordingly, the second n-type carrier concentration Cn2 may be greater than that of the first n-type carrier concentration Cn1.

Since the lower channel region 124 is doped with an n-type dopant, carrier mobility is increased, and as a result, a cell current may be increased and a turn-on failure of the memory cell transistor due to trapped electrons may be prevented. Therefore, the semiconductor device 1000 may operate fast and reliably.

Figure 4:
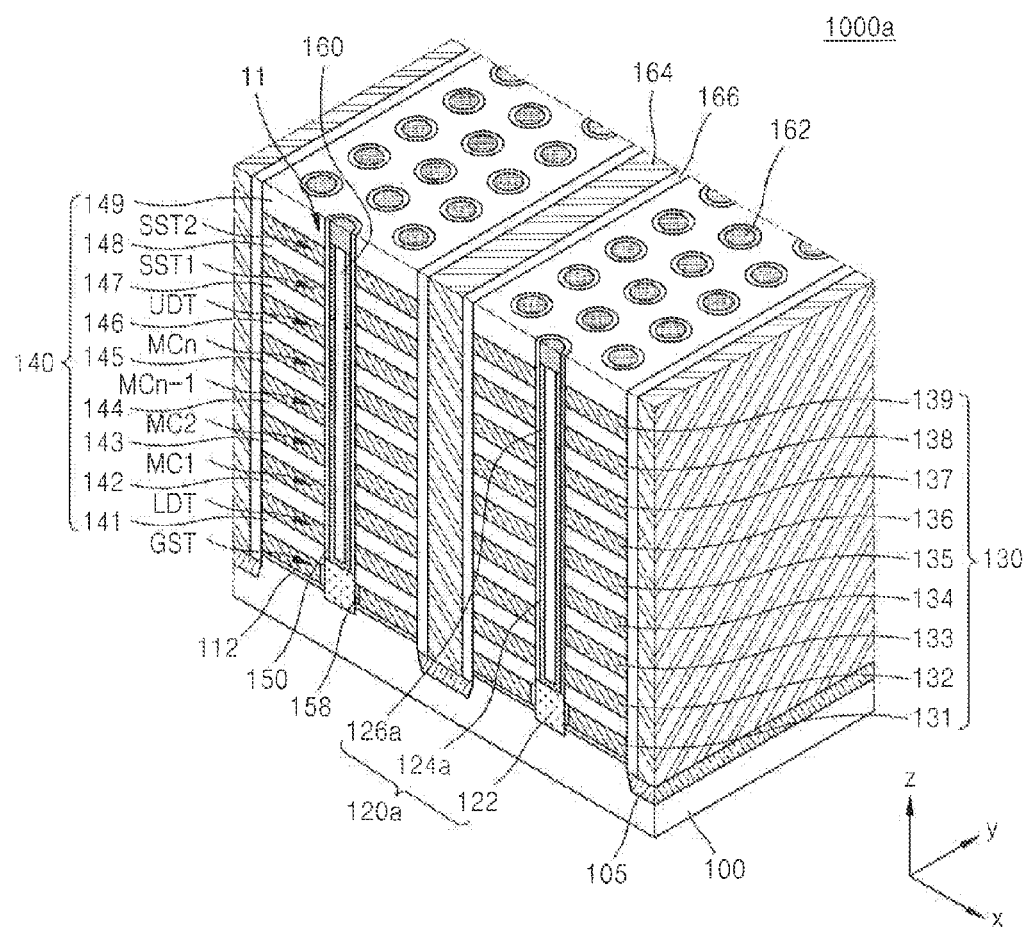
FIG. 4 is a perspective view of a semiconductor device according to an exemplary embodiment of the present inventive concept.

FIG. 4 is a perspective view of a semiconductor device 1000a according to an exemplary embodiment of the present inventive concept. The semiconductor device 1000a is similar to the semiconductor device 1000 of FIGS. 2A and 2B except for the structure of a channel layer 120a, and thus, such differences between the semiconductor devices 1000 and 1000a will be described.

Referring to FIG. 4, the channel layer 120a includes a channel contact region 122, a lower channel region 124a, and an upper channel region 126a.

The lower and upper channel regions 124a and 126a include an n-type dopant. The concentration of the n-type dopant in the lower and upper channel regions 124a and 126a may be in a range from about 5E16 atoms/cm$^3$ to about 1E19 atoms/cm$^3$. The lower and upper channel regions 124a and 126a may have substantially the same n-type dopant concentration. Alternatively, the upper channel region 126a may have a lower n-type dopant concentration than that of the lower channel region 124a.

A plurality of string selection transistors SST1 and SST2 is formed on sidewalls of the upper channel region 126a. When the upper channel region 126a includes an n-type dopant, threshold voltages of the string selection transistors SST1 and SST2 may be controlled by configuring at least two string selection transistors SST1 and SST2 in series.

Figure 5:
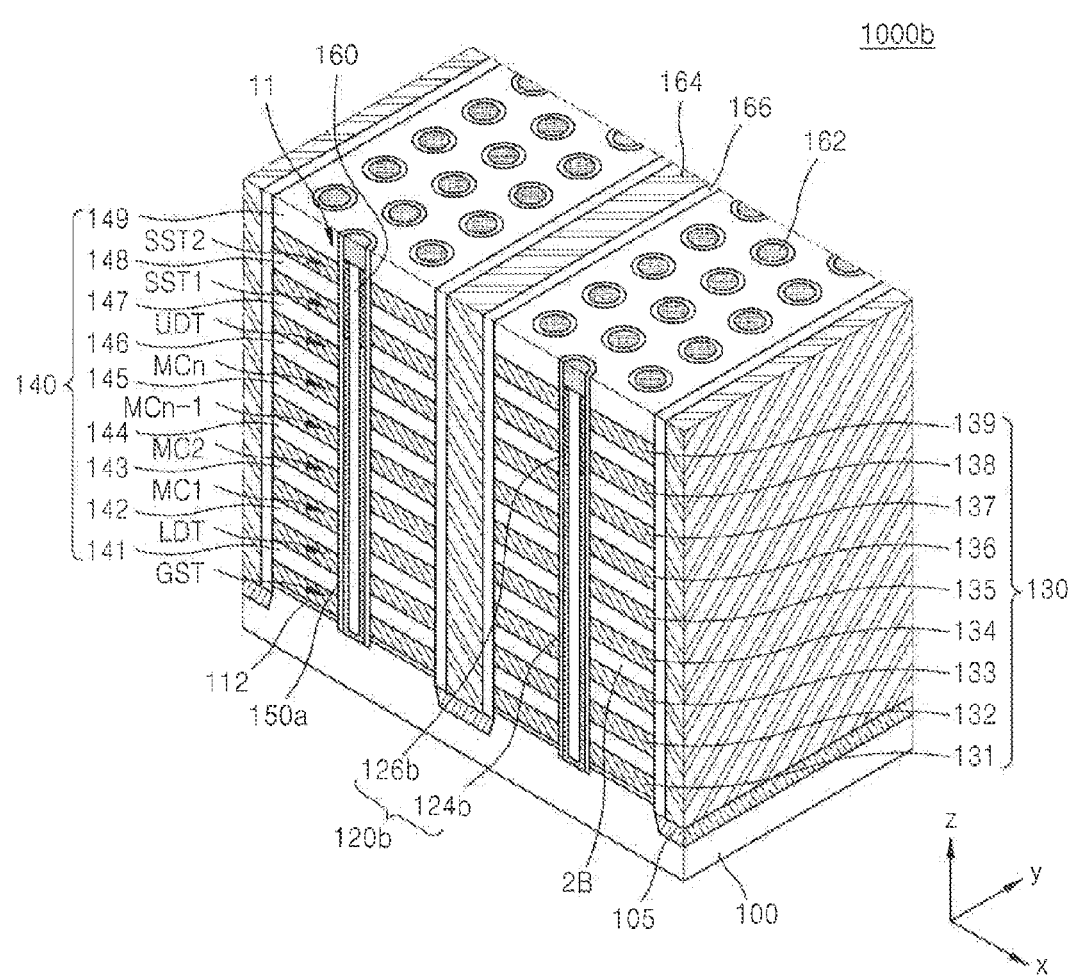
FIG. 5 is a perspective view of a semiconductor device according to an exemplary embodiment of the present inventive concept.

FIG. 5 is a perspective view of a semiconductor device 1000b according to an exemplary embodiment of the present inventive concept. The semiconductor device 1000b is similar to the semiconductor device 1000 described with reference to FIGS. 2A and 2B except for the structure of a channel layer 120b, and thus, such differences between the semiconductor devices 1000 and 1000b will be described.

Referring to FIG. 5, the channel layer 120b does not include the channel contact region 122 and the second gate insulating layer 158 of FIG. 2A. For example, the channel layer 120b includes a lower channel region 124b and an upper channel region 126b only.

A lower surface of the lower channel region 124b is in contact with an upper surface of the substrate 100, and the lower channel region 124b extends in the z-direction. A first gate insulating film 150a is formed on a sidewall of the lower channel region 124b, and a bottom surface of the first gate insulating film 150a is contact with the upper surface of the substrate 100. Accordingly, the first gate insulating film 150a is interposed between the first gate electrode 131 and the lower channel region 124b.

Both the lower channel region 124b and the substrate 100 may act as a channel region of a ground selection transistor GST. For example, the first gate electrode 131 the substrate 100, and the lower insulating layer 112 that is interposed therebetween may serve as part of the ground selection transistor GST. Also, the first gate electrode 131, the lower channel region 124b, and the first gate insulating film 150a that is interposed therebetween may serve as the remaining part of the ground selection transistor GST. For example, the substrate 100 includes a p-type dopant, and the lower channel region 124b includes an n-type dopant, and thus a threshold voltage of transistor formed on the lower channel region 124b may be adjusted depending on the concentrations of the p-type and n-type dopants.

FIGS. 6A through 6J are cross-sectional views showing a method of manufacturing the semiconductor device 1000 according to an exemplary embodiment of the present inventive concept.

Figure 6A:
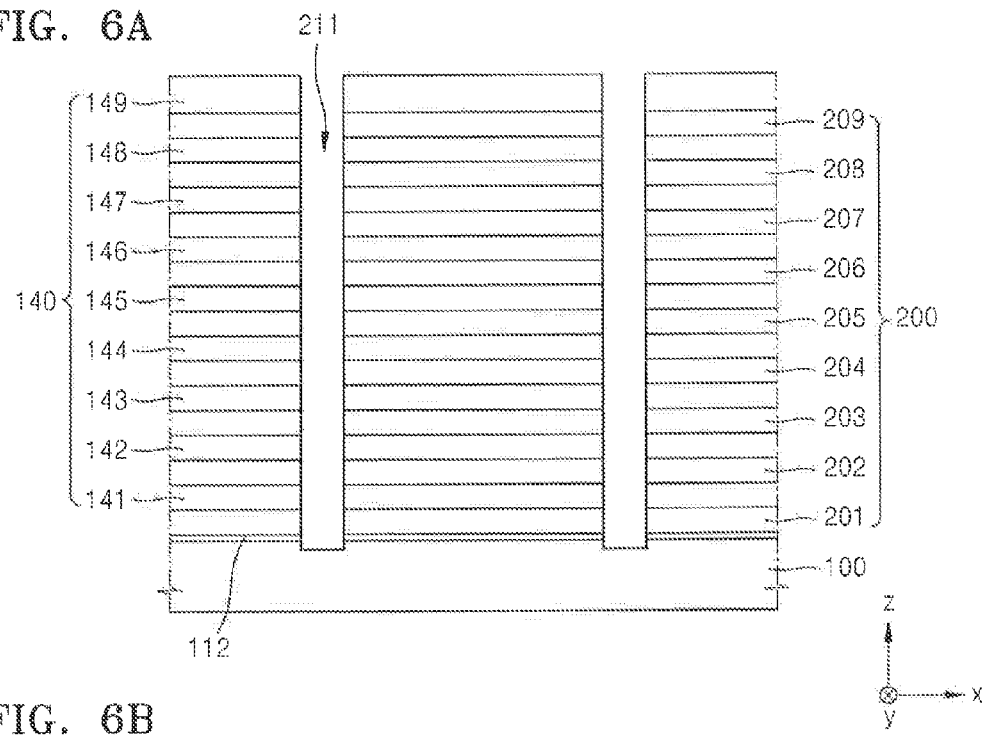

Referring to FIG. 6A, the lower insulating layer 112 is formed on the substrate 100. The lower insulating layer 112 may be formed of silicon oxide, silicon nitride, or silicon oxynitride. The lower insulating layer 112 may be formed by using a chemical vapor deposition (CVD) process, or an atomic layer deposition (ALD) process.

Sacrifice layers including first through ninth sacrifice layers 201 through 209, and insulating layers including first through ninth insulating layers 141 through 149 are alternately formed on the lower insulating layer 112. For example, sacrifice layers 200 and insulating layers 140 form a stack structure where the first sacrifice layer 201 is formed on the lower insulating layer 112 and the first insulating layer 141 is formed on the first sacrifice layer 201. The insulating layers 140 may be formed of silicon oxide, silicon nitride, or silicon oxynitride, and may be formed by using a CVD process, or an ALD process. Also, the sacrifice layers 200 may be formed of a material having etch selectivity with respect to the insulating layers 140. For example, the sacrifice layers 200 may be formed of polysilicon, silicon nitride, or a silicon carbide formed by using a CVD process or an ALD process.

Channel holes 211 are formed in the stack structure of the insulating layers 140 and the sacrifice layers 200. For example, the channel holes 211 penetrate the insulating layers 140, the sacrifice layers 200 and the lower insulating layer 112, exposing an upper surface of the substrate 100. The substrate 100 is recessed to a predetermined depth by over-etching the upper surface of the substrate 100 that is exposed by the channel hole 211.

The channel holes 211 extends in the z-direction that is perpendicular to the upper surface of the substrate 100. The channel holes 211 are spaced apart from each other at a predetermined distance along the x and y-directions. A horizontal cross-section of the channel hole 211 may be a circular shape, but is not limited thereto. The horizontal cross-section of the channel hole 211 may have various shapes.

Figure 6B:
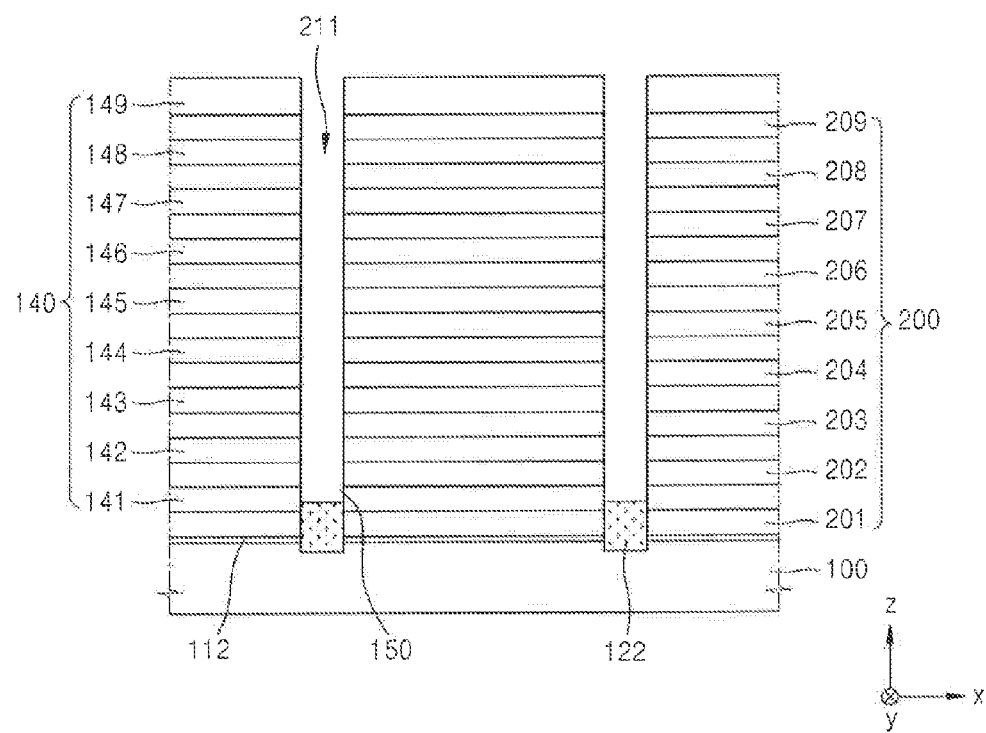

Referring to FIG. 6B, a channel contact region 122 is formed on a bottom part of the channel hole 211. The channel contact region 122 may be grown from the exposed upper surface of the substrate 100 by performing a SEG process. The upper surface of the channel contact region 122 is higher than the upper surface of the first sacrifice layer 201.

A p-type dopant may be injected to the channel contact region 122 by using an ion implantation process. For example, the p-type dopant may include Al, B, In, or K, and the concentration of the p-type dopant may be in a range from about 5E16 atoms/cm$^3$ to about 1E19 atoms/cm$^3$. Alternatively, the p-type dopant may be doped in an in-situ process when the channel contact region 122 is formed using a SEG process.

Referring to FIG. 6C, a first gate insulating layer 149 is formed. An insulating layer (not shown) is conformally formed on the exposed upper surface of the substrate 100, the inner wall of the channel hole 211 and the upper surface of the ninth insulating layer 149. An anisotropic etching process is performed such that the insulating layer remains on the sidewall of the channel hole 211 only. The remaining insulating layer corresponds to the first gate insulating layer 149. The first gate insulating film 150 is in contact with the upper surface of the channel contact region 122, exposing the upper surface of the channel contact region 122. The insulating layer that is formed on the upper surface of the ninth insulating layer 149 is removed by the anisotropic etching process.

A preliminary channel layer 120p is formed on the first gate insulating film 150, the channel contact region 122, and the ninth insulating layer 149. The preliminary channel layer 120p is conformally formed on an inner wall of the channel hole 211 at a predetermined thickness. The preliminary channel layer 120p does not completely fill the channel hole 211.

The preliminary channel layer 120p may be formed of polysilicon by using an ALD process or a CVD process, and an n-type dopant may be doped in an in-situ process of forming the preliminary channel layer 120p. The n-type dopant may include P, As, or Sb, and the concentration of the n-type dopant may be in a range from about 5E16 atoms/cm$^3$ to about 1E19 atoms/cm$^3$.

A thermal treatment process P1 may be performed on the preliminary channel layer 120p. In the thermal treatment process P1, the n-type dopant that is in-situ doped in the preliminary channel layer 120p may be uniformly diffused to the entire region of the preliminary channel layer 120p. The thermal treatment process P1 may be performed for a few seconds to a few hours at a temperature in a range from about 200° C. to about 700° C. The temperature and the time for the thermal treatment process P1 are not limited thereto, and the temperature and time may be varied according to the concentration of the n-type dopant and the thickness of the preliminary channel layer 120p.

Referring to FIG. 6D, a buried insulating layer 160 is formed in the channel hole 211. An insulating layer (not shown) is formed, filling the channel hole 211 of FIG. 6C. The insulating layer is formed on the preliminary channel layer 120p. A planarizing process is performed on the insulating layer and the preliminary channel layer 120p until the upper surface of the ninth insulating layer 149 is exposed. Accordingly, the preliminary channel layer 120p remains in the channel hole 211 only. The remaining insulating layer corresponds to the buried insulating layer 160. The preliminary channel layer 120p is U-shaped. The upper ends of the preliminary channel layer 120 is open and the lower ends of the preliminary channel layer 120 is closed.

The upper ends of the preliminary channel layer 120p are substantially coplanar with the upper surface of the buried insulating layer 160.

Figure 6E:
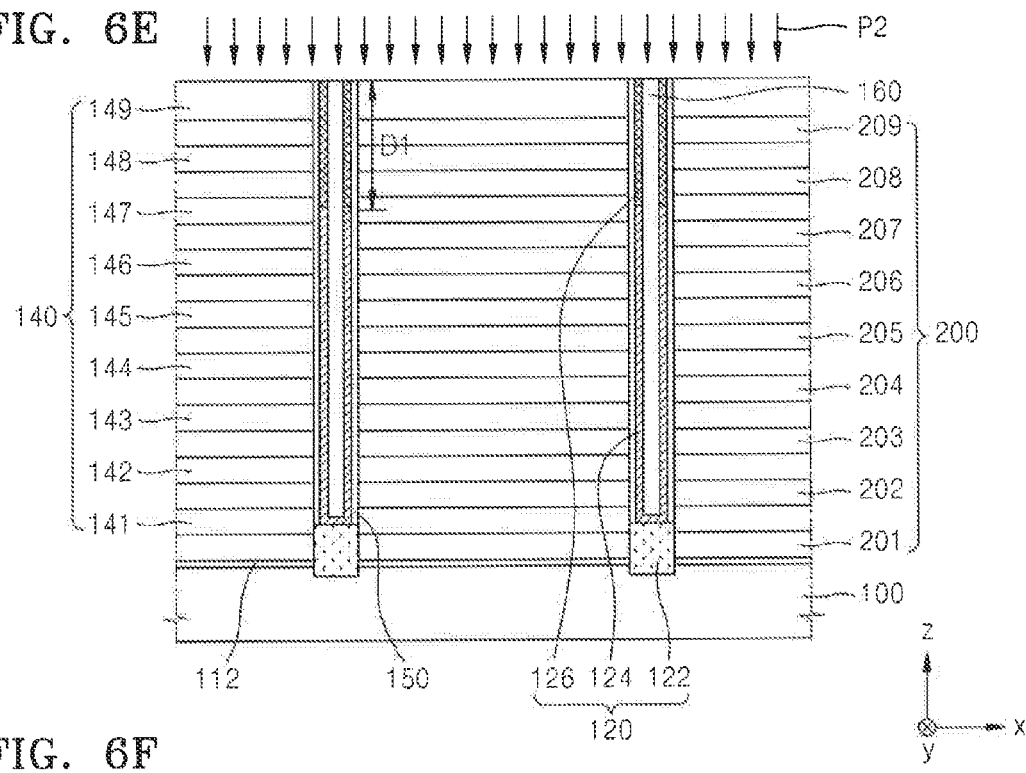

Referring to FIG. 6E, an ion implantation process P2 is performed to inject a p-type dopant into an upper part of the preliminary channel layer 120p. The upper part of the preliminary channel layer 120p corresponds to an upper channel region 126, and the remaining lower part of the preliminary channel layer 120p corresponds to a lower channel region 124. The concentration of the p-type dopant in the upper channel region 126 may be in a range from about 5E16 atoms/cm$^3$ to about 1E19 atoms/cm$^3$.

For example, the ion implantation process P2 is performed using a process condition such that part of the preliminary channel layer 120p corresponding to a first depth D1 is converted to the upper channel region 126. The first depth D1 is measured from the upper ends of the preliminary channel layer 120p. For example, the boundary between the upper and lower channel regions 126 and 124 is lower than the bottom surface of the eighth sacrifice layer 208. In this case, a channel region of string selection transistors (not shown) that are to be formed by substituting the eighth and ninth sacrifice layers 208 and 209 on the locations of the eighth and ninth sacrifice layers 208 and 209 may include a polysilicon layer that includes a p-type dopant. The first depth D1 may vary according to the control of ion implantation energy in the ion implantation process P2.

The lower channel region 124 does not receive the p-type dopant in the ion implantation process P2. The channel contact region 122, the lower channel region 124, and the upper channel region 126 are defined as a channel layer 120.

Alternatively, the ion implantation process P2 is not performed. In this case, the channel region 120 may be defined by the preliminary channel layer 120p of FIG. 6D and the channel contact region 122. The preliminary channel layer 120p includes an n-type dopant only. Such alternative channel region 120 is incorporated in the semiconductor device 1000a of FIG. 4.

Figure 6F:
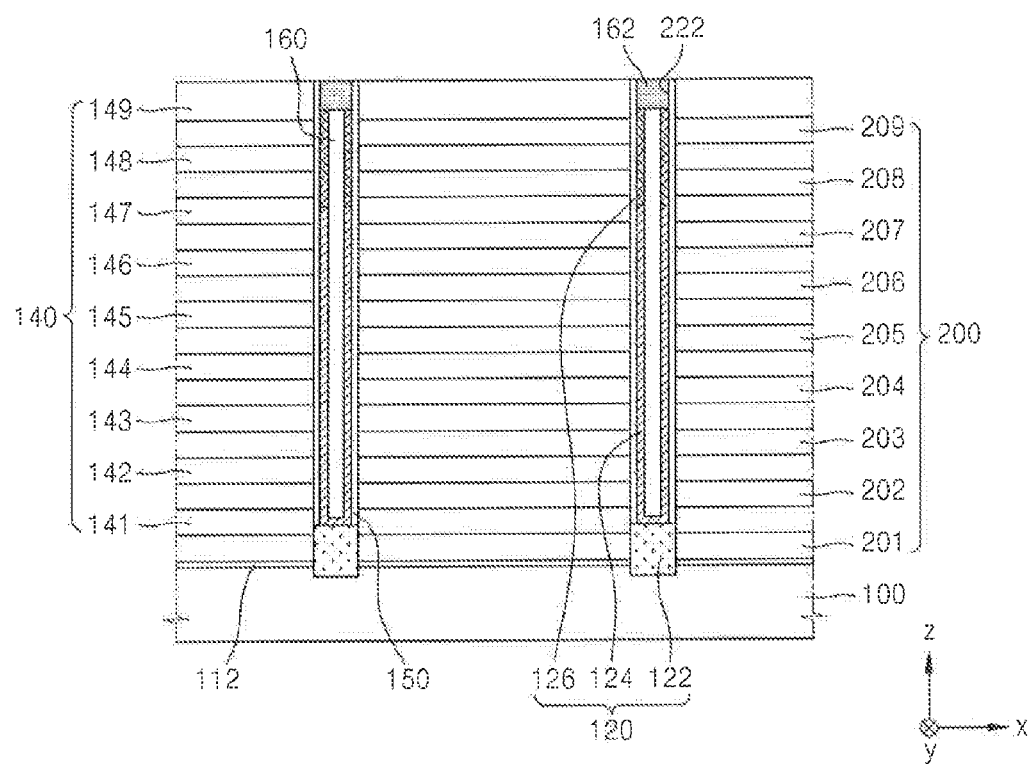

Referring to FIG. 6F, a drain region 162 is formed. An etch-back process may be performed on the resulting structure of FIG. 6E. The upper channel region 126 and the buried insulating layer 160 are partially removed such that a first opening 222 is formed. The first opening 222 may have a predetermined depth from the upper surface of the ninth insulating layer 149. The upper ends of the upper channel region 126 are lowered, and the upper surface of the buried insulating layer 160 is lowered.

A first conductive layer (not shown) is formed on the ninth insulating layer 149, completely filling the first opening 222. The first conductive layer is planarized until the upper surface of the ninth insulating layer 149 is exposed. Accordingly, the first conductive layer remains in the first opening 222 only. The remaining first conductive layer corresponds to the drain region 162. The bottom surface of the drain region 162 is in contact with the lowered upper surface of the buried insulating layer 160 and the lowered upper ends of the upper channel region 126.

The drain region 162 may be formed of polysilicon that includes an n-type dopant. The concentration of the n-type dopant may be in a range from about 1E18 atoms/cm$^3$ to about 5E21 atoms/cm$^3$.

Referring to FIG. 6G, a second opening 223 and third openings 225 are formed. The second opening 223, extending in the y-direction, penetrates in the z-direction the stack structure of the insulating layers 140 and the sacrifice layers 200 of FIG. 6F. The portion of the lower insulating layer 112 underneath the second opening 223 is removed, and the upper surface of the substrate 100 is exposed through the second opening 223.

The third openings 225 are formed by removing the sacrifice layers 200 through the second opening 223. Each third opening 225 is defined as space between two adjacent insulating layers 140 and the first gate insulating film 150.

For example, the third openings 225 may be formed by using a wet etching process in which an etchant has etch selectivity with respect to the sacrifice layers 200. For example, when the sacrifice layers 200 include silicon nitride, the etchant may include $H_3PO_4$.

The third openings 225 expose the sidewalls of the first gate insulating film 150 and the channel contact region 122.

Referring to FIG. 6, a second gate insulating film 158 is further formed using a thermal oxidation process. The second gate insulating film 158 is selectively on the sidewalls of the channel contact region 122. The second gate insulating film 158 may be formed of silicon oxide that is formed in the thermal oxidation process.

Although not shown, the exposed upper surface of the substrate 100 may be oxidized in the thermal oxidation process. In this case, an anisotropic etching process may be performed to remove the oxidized portion of the exposed upper surface in the substrate 100.

Referring to FIG. 6H, a preliminary gate conductive layer 130p is formed to fill the second and third openings 223 and 225 of FIG. 6G. The diffusion barrier layer 170 of FIG. 2B is formed on the sidewalls of the second and third openings 223 and 225 of FIG. 6G. The diffusion barrier 170 has a predetermined thickness at which the diffusion barrier 170 does not completely fill the second and third openings 223 and 225. The preliminary gate conductive layer 130p is formed on the diffusion barrier layer 170, completely filling the second and third openings 223 and 225.

The preliminary gate conductive layer 130p may include, for example, tungsten, cobalt, nickel, tantalum, tungsten nitride, tungsten silicide, cobalt silicide, nickel silicide, or tantalum silicide.

Figure 6I:
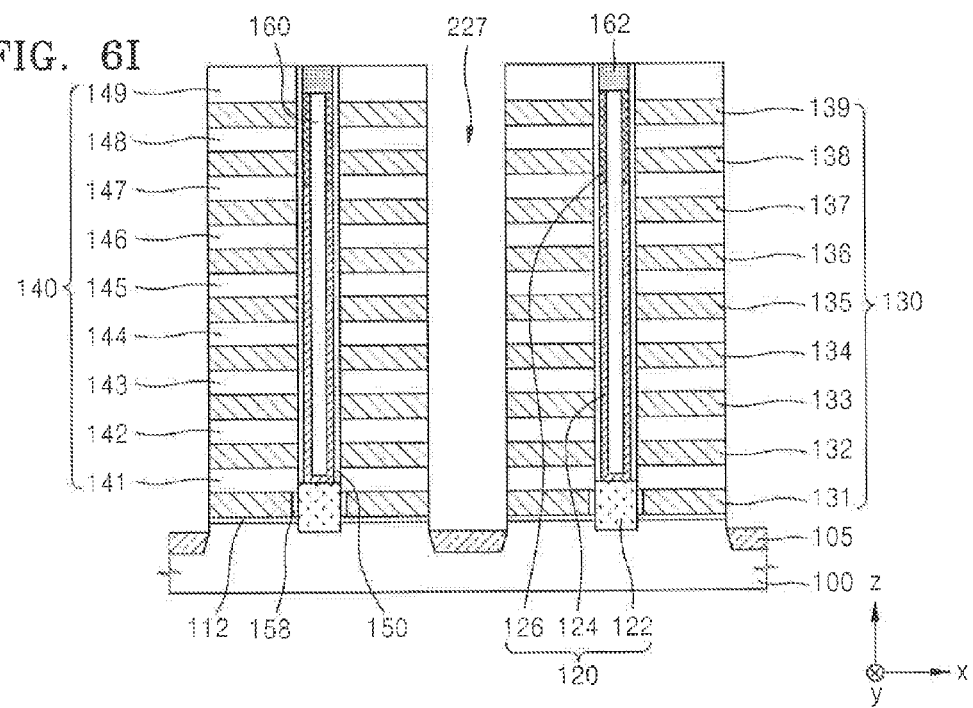

Referring to FIG. 6I, a fourth opening 227 and gate electrodes 130 are formed. The fourth opening 227, extending in the y-direction, penetrates in the z-direction the preliminary gate conductive layer 130p to expose the upper surface of the substrate 100 through the lower insulating layer 112. The patterned preliminary gate conductive layer 130p by the fourth opening 227 remains between two adjacent insulating layers 140, filling the third openings 225 of FIG. 6G. Such patterned preliminary gate conductive layer 130p corresponds to the gate electrodes 130.

The upper surface of the substrate 100 is recessed to a predetermined depth by over-etching the substrate 100 that is exposed by the fourth opening 227.

The recessed upper surface of the substrate 100 is doped with an n-type dopant to form a common source region 105.

Figure 6J:
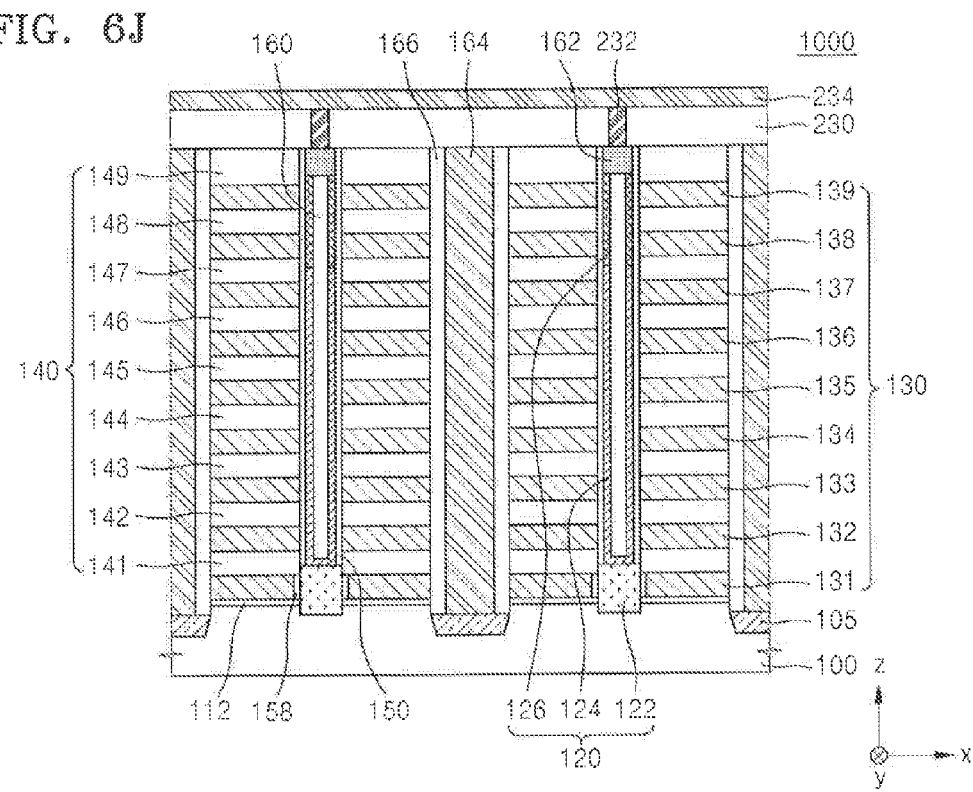

Referring to FIG. 6J, a spacer 166 is formed on the sidewalls of the fourth opening 227 of FIG. 6I. An insulating layer (not shown) is formed on the sidewalls of the fourth opening 227, the upper surface of the ninth insulating layer 149 and the upper surface of the common source 105. An anisotropic etching process is performed on the insulating layer such that the insulating layer remains only on the sidewalls of the fourth opening 227. Such remaining insulating layer corresponds to the spacer 166. The spacer 166 may be formed of, for example, silicon nitride, silicon oxynitride, or silicon oxide.

Next, a common source line 164 is formed. A second conductive layer (not shown) is formed on the ninth insulating layer 149, the spacer 166 and the common source region 105, completely filling the fourth opening 227 of FIG. 6I. A planarizing process applies to the second conductive layer, until the upper surface of the ninth insulating layer 149 is exposed. Accordingly, the second conductive layer remains only in the fourth opening 227. Such remaining second conductive layer corresponds to the common source line 164. The common source line 164 is electrically connected to the common source region 105. The upper surface of the common source line 164 is substantially coplanar with the upper surface of the drain region 162. The common source line 164 may be formed of tungsten, cobalt, tantalum, tungsten silicide, cobalt silicide, or tantalum silicide.

Although not shown, an etch-stop film (not shown) is further formed on the drain region 162 and the ninth insulating layer 149. In this case, the upper surface of the common source line 164 may be substantially coplanar with the upper surface of the etch-stop film.

A first interlayer insulating layer 230 is formed on the ninth insulating layer 149, the drain region 162 and the common source line 164.

A bit line 234 is formed on the first interlayer insulating layer 230 and is electrically connected to the drain region 162 through a bit line contact 232. The bit line contact 232 is formed in a bit line contact hole penetrating the first interlayer insulating layer 230 and exposing the upper surface of the drain region 162. A third conductive layer (not shown) is formed on the upper surface of the first interlayer insulating layer 230, completely filling the bit line contact hole. A planarizing process is applied to the third conductive layer until the upper surface of the first interlayer insulating layer 230 is exposed. The planarized third conductive layer, remaining in the bit line contact hole, corresponds to the bit line contact 232.

The bit line 234 is in contact with the bit line contact 232 and extends in the x-direction.

According to an exemplary embodiment of the present inventive concept, the lower channel region 124 includes a uniform n-type dopant concentration on the entire region thereof. The n-type dopant is doped in-situ process when the preliminary channel layer 120p is formed, and then doped n-type dopant is uniformly diffused in the entire region by a heat treatment. Accordingly, the parasitic resistance of the memory cell transistors MC1, MC2, . . . , MCn−1, and MCn that are formed on the lower channel region 124 is reduced, and thus, the electrical characteristics and reliability of the semiconductor device 1000 are increased. The upper channel region 126 is formed by injecting a p-type dopant by an ion implantation process in the preliminary channel layer 120p. Using an ion implantation process, the lower channel region 124 and the upper channel region 126 that respectively include an n-type dopant and a p-type dopant are formed.

Figure 7A:
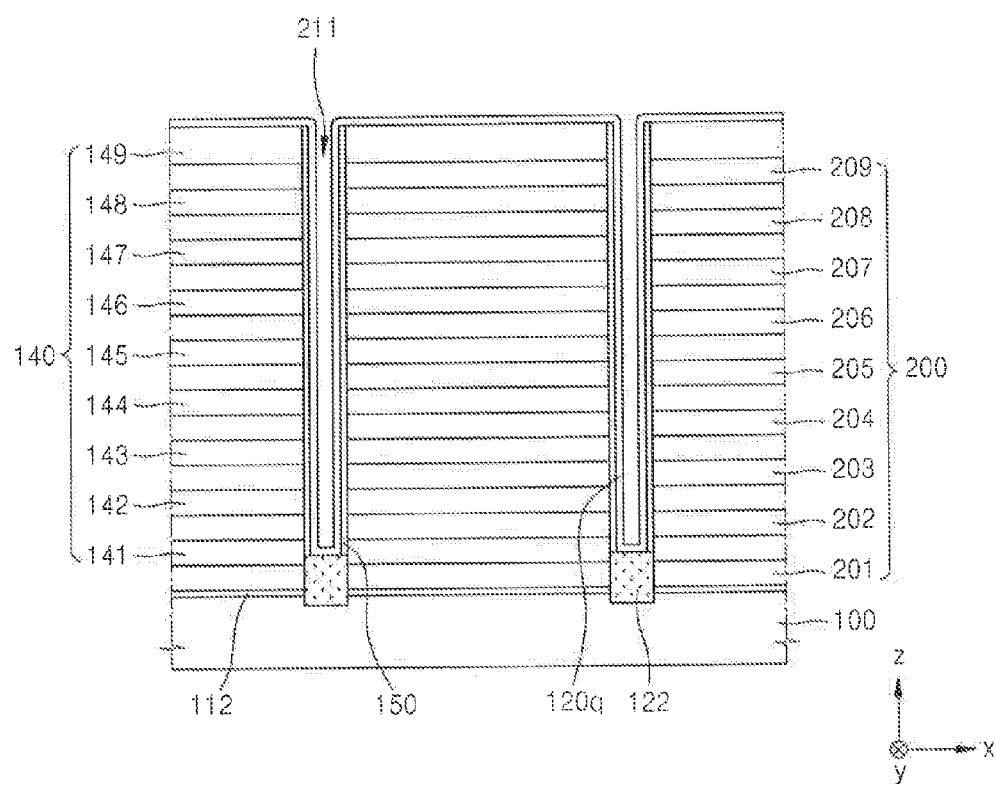
FIGS. 7A through 7C are cross-sectional views showing a method of manufacturing a semiconductor device according to an exemplary embodiment of the present inventive concept.
Figure 7B:
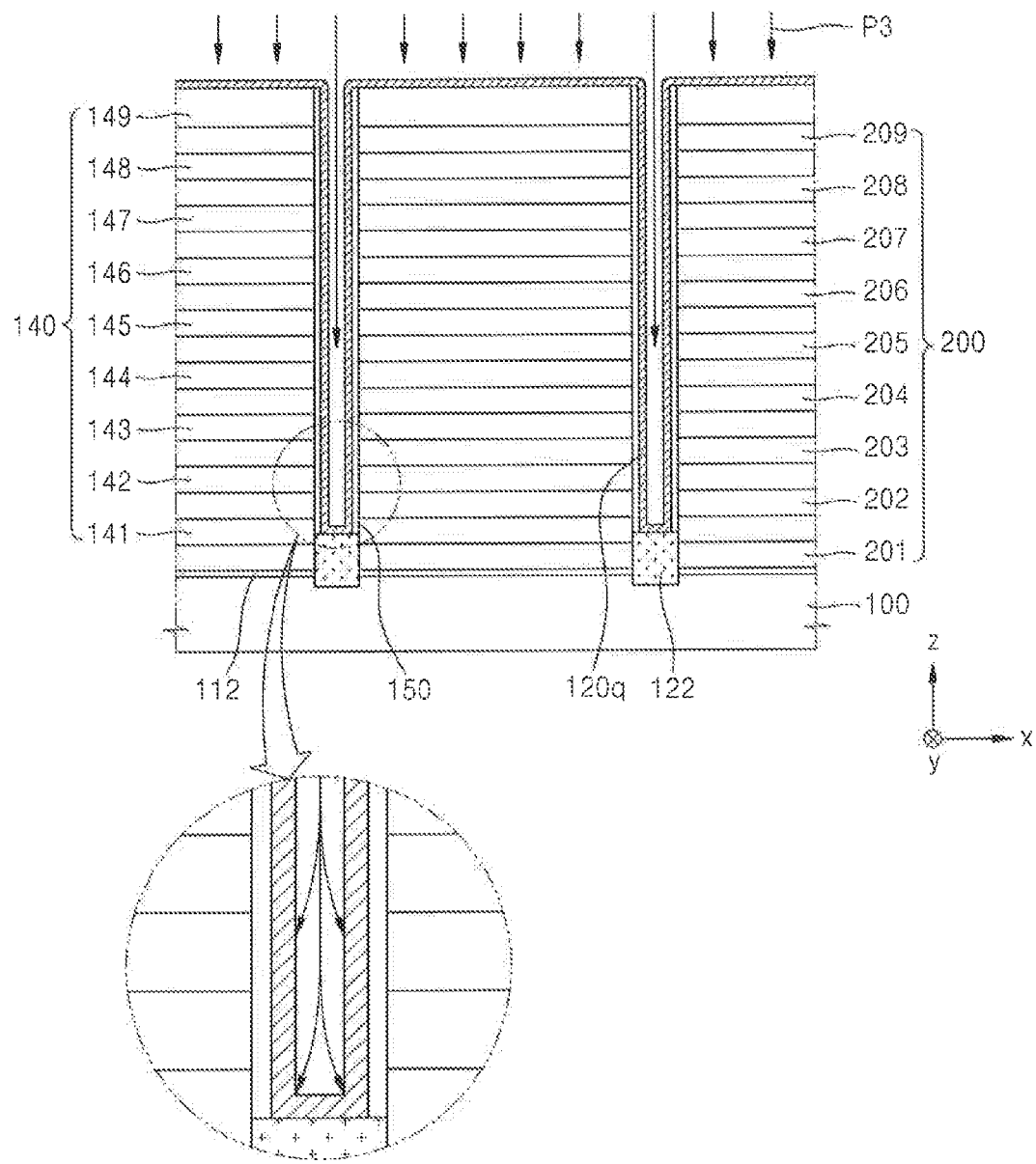
Figure 7C:
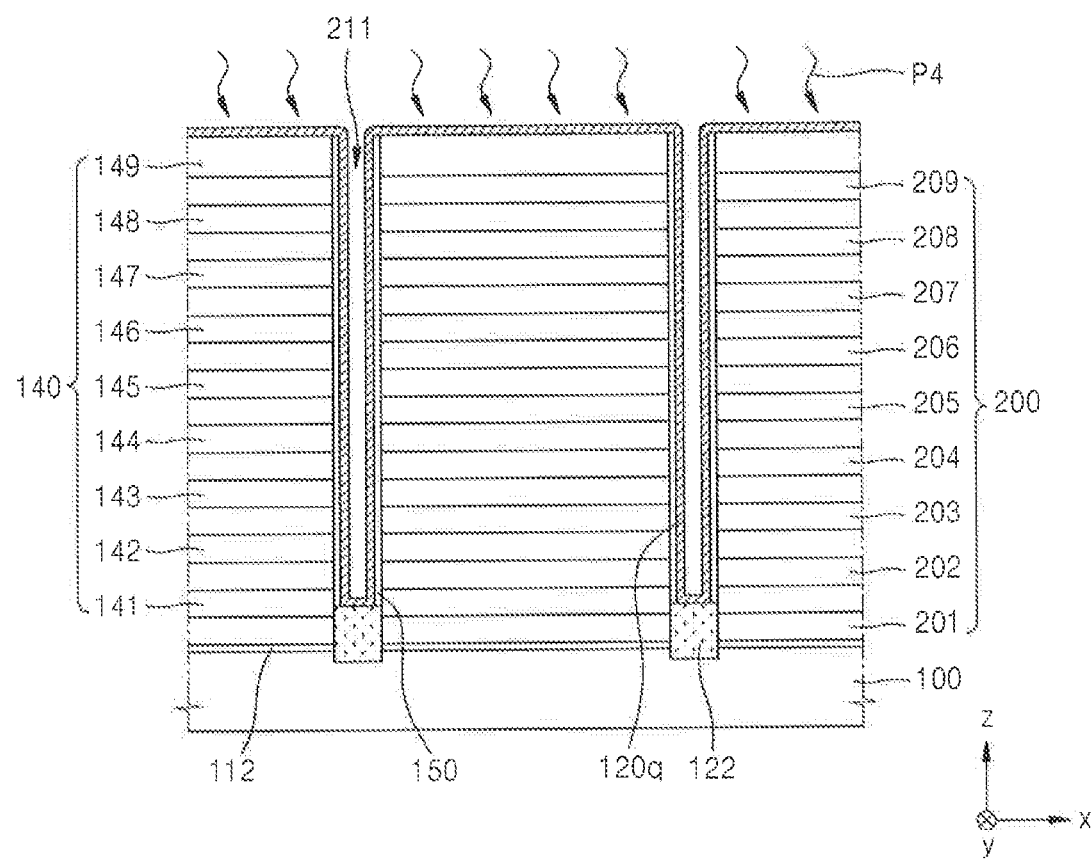

FIGS. 7A through 7C are cross-sectional views showing a method of manufacturing the semiconductor device 1000a of FIG. 4 according to an exemplary embodiment of the present inventive concept. The method may be substantially similar to the exemplary method described with reference to FIGS. 6A to 6J, except for process steps of forming the lower channel region 124. Such differences will be mainly described below.

Referring to FIG. 7A, a preliminary channel layer 120q is formed on the resulting structure of FIG. 6B. For example, the preliminary channel layer 120q is formed on the ninth insulating layer 149, the first gate insulating film 150, and the channel contact region 122. The preliminary channel layer 120q may be formed of polysilicon that is not doped with a dopant. The preliminary channel layer 120q may be formed by using a CVD process or an ALD process.

Referring to FIG. 7B, the preliminary channel layer 120q is doped with an n-type dopant by performing a gas phase doping process P3.

For example, the gas phase doping process P3 is performed using a source gas that includes an n-type dopant. The source gas is supplied to an entire surface of the preliminary channel layer 120q at a predetermined flux, and the n-type dopant may be diffused from the surface into the inside of the preliminary channel layer 120q. Since the channel hole 211 has a high aspect ratio, the flux of the source gas may be supplied in various sequences so that the source gas can be uniformly supplied to the portion of the preliminary channel layer 120q in the bottom part of the channel hole 211. For example, as depicted in FIG. 7B, the n-type dopant may be uniformly doped on the entire region of the preliminary channel layer 120q by sufficiently supplying the source gas to the bottom part of the channel hole 211 along a direction indicated by the arrows.

Referring to FIG. 7C, a thermal treatment process P4 is performed.

The thermal treatment process P4 may cause the n-type dopant concentrated near the surface of the preliminary channel layer 120q to be uniformly diffused into the preliminary channel layer 120q.

Additional process steps described with reference to FIGS. 6D through 6J are applied to the resulting structure of FIG. 7C.

The n-type dopant is doped into the preliminary channel layer 120q by performing a gas phase doping process. Alternatively, the preliminary channel layer 120q is doped with an n-type dopant by an ion implantation process. The ion implantation process may be performed using a tilted ion implantation process. Accordingly, the n-type dopant may be doped with a uniform concentration in the entire region of the preliminary channel layer 120q along the z-direction.

Figure 8A:
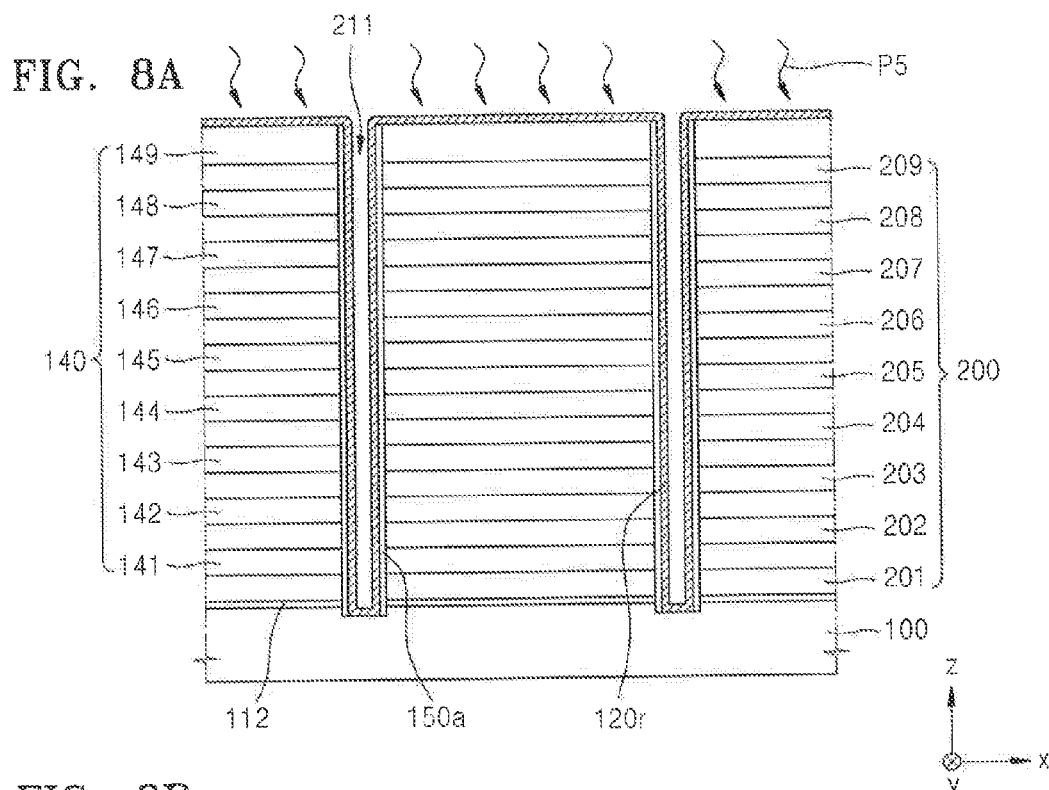
FIGS. 8A and 8B are cross-sectional views showing a method of manufacturing the semiconductor device according to an exemplary embodiment of the present inventive concept.
Figure 8B:
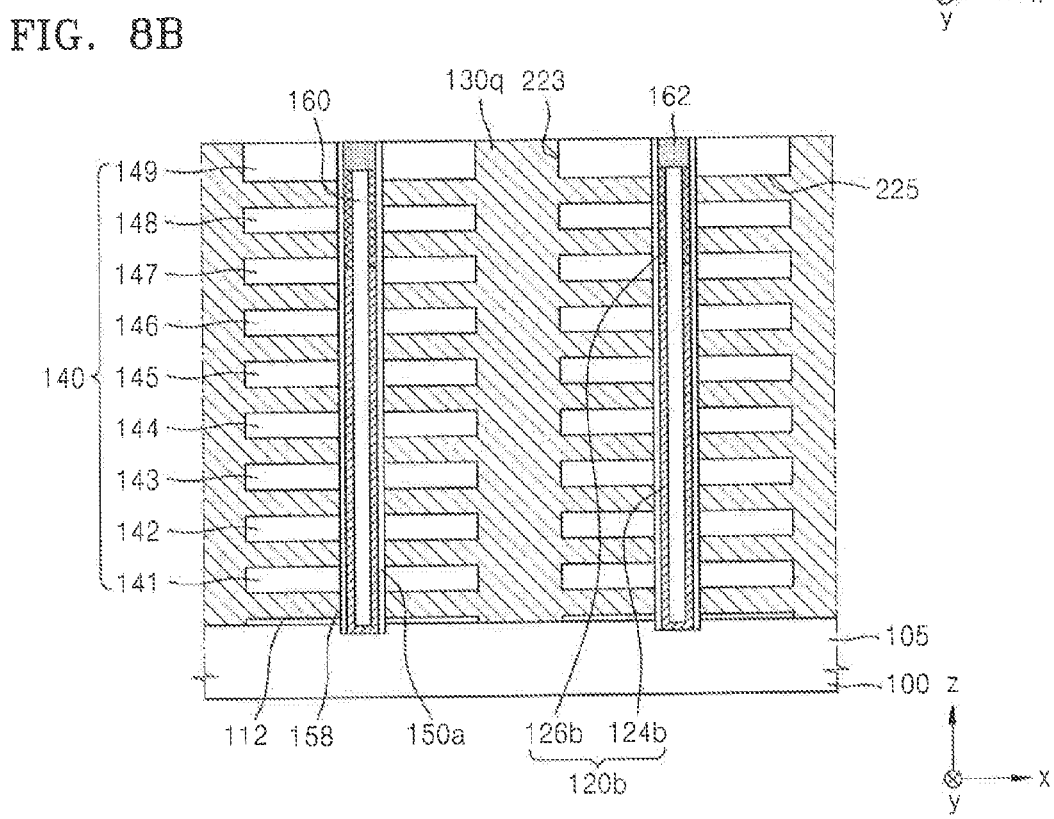

FIGS. 8A and 8B are cross-sectional views showing a method of manufacturing the semiconductor device 1000b of FIG. 5 according to an exemplary embodiment of the present inventive concept. The method is substantially similar to the method described with reference to FIGS. 6A through 6J, except for the process steps of forming the channel contact region 122 and the second gate insulating film 158. In this exemplary method, the process steps of forming the channel contact region 122 and the second gate insulating film 158 of FIGS. 6A through 6J are omitted.

Referring to FIG. 8A, the channel hole 211 is formed, penetrating the stack structure and the lower insulating layer 112 and exposing the upper surface of the substrate 100. Since the process step of forming the channel contact region 122 of FIG. 6B is omitted, the process steps of forming the channel hole 211 is applied to the resulting structure of FIG. 6A.

For example, an insulating layer (not shown) is formed on the resulting structure of FIG. 6A. The insulating layer is formed on the ninth insulating layer 149, the sidewalls of the channel hole 211, and the exposed upper surface of the substrate 100. An anisotropic etching process is applied to the insulating layer. The lower ends of the first gate insulating film 150a are in contact with the upper surface of the substrate 100. The exposed upper surface of the substrate 100 is recessed to a predetermined depth in the process of forming the channel hole 211. The bottom surface of the first gate insulating film 150a is lower than the upper surface of the substrate 100.

A preliminary channel layer 120r is formed on the ninth insulating layer 149 and the sidewalls of the channel hole 211. The preliminary channel layer 120r may be formed of polysilicon doped with an n-type dopant.

A thermal treatment process P5 is performed.

Next, the process steps described with reference to FIGS. 6D through 6G are performed to form a preliminary gate conductive layer 130q of FIG. 8B. The preliminary gate conductive layer 130q fills the second and third openings 223 and 225. Since the process step of forming the channel contact region 122 of FIG. 6B is omitted, the process step of forming the second gate insulating film 158 of FIG. 6G is omitted.

Figure 9:
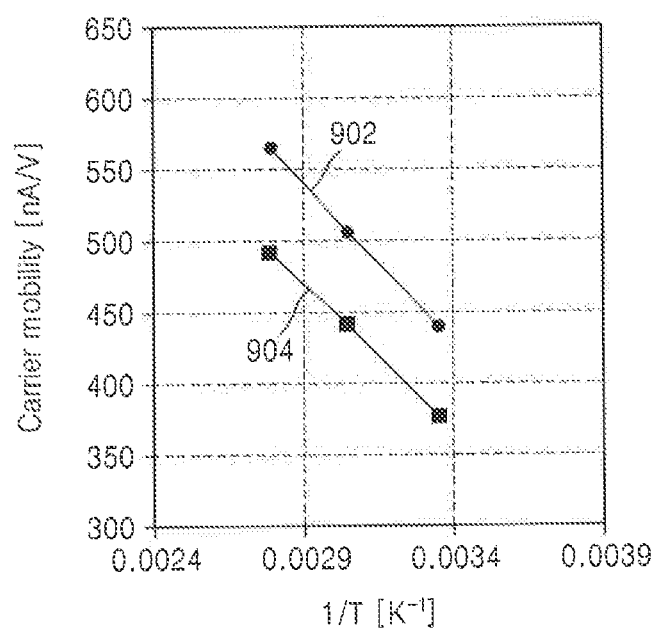
FIG. 9 is a graph showing carrier mobility of a semiconductor device according to an exemplary embodiment of the present inventive concept.

FIG. 9 is a graph showing a result of measuring carrier mobility in a channel layer of a semiconductor device according to an exemplary embodiment of the present inventive concept.

Referring to FIG. 9, the carrier mobility of experiment 902 is higher than that of experiment 904. For experiment 902, the channel layer is doped with an n-type dopant; for experiment 904, the channel layer is not doped with the n-type dopant. For example, the carrier mobility of experiment 902 is about 445 nA/V at about 30° C.; the carrier mobility of experiment 904 is about 380 nA/V at about 30° C. For about 100° C., experiment 902 and experiment 904 respectively show carrier mobilities of about 570 nA/V and about 490 nA/V.

If the channel layer includes polysilicon, the grain boundary of polysilicon may lower the carrier mobility. For example, the potential barrier at the grain boundary is higher as the number of electrons trapped in the grain boundary increases and is lower as the concentration of the n-type dopant is increased. According to an exemplary embodiment, the potential barrier at the grain boundary may be lowered since the n-type dopant may provide electrons to the channel layer, and thus, the carrier mobility may be increased. Such increase in the carrier mobility is shown in FIG. 9.

Figure 10:
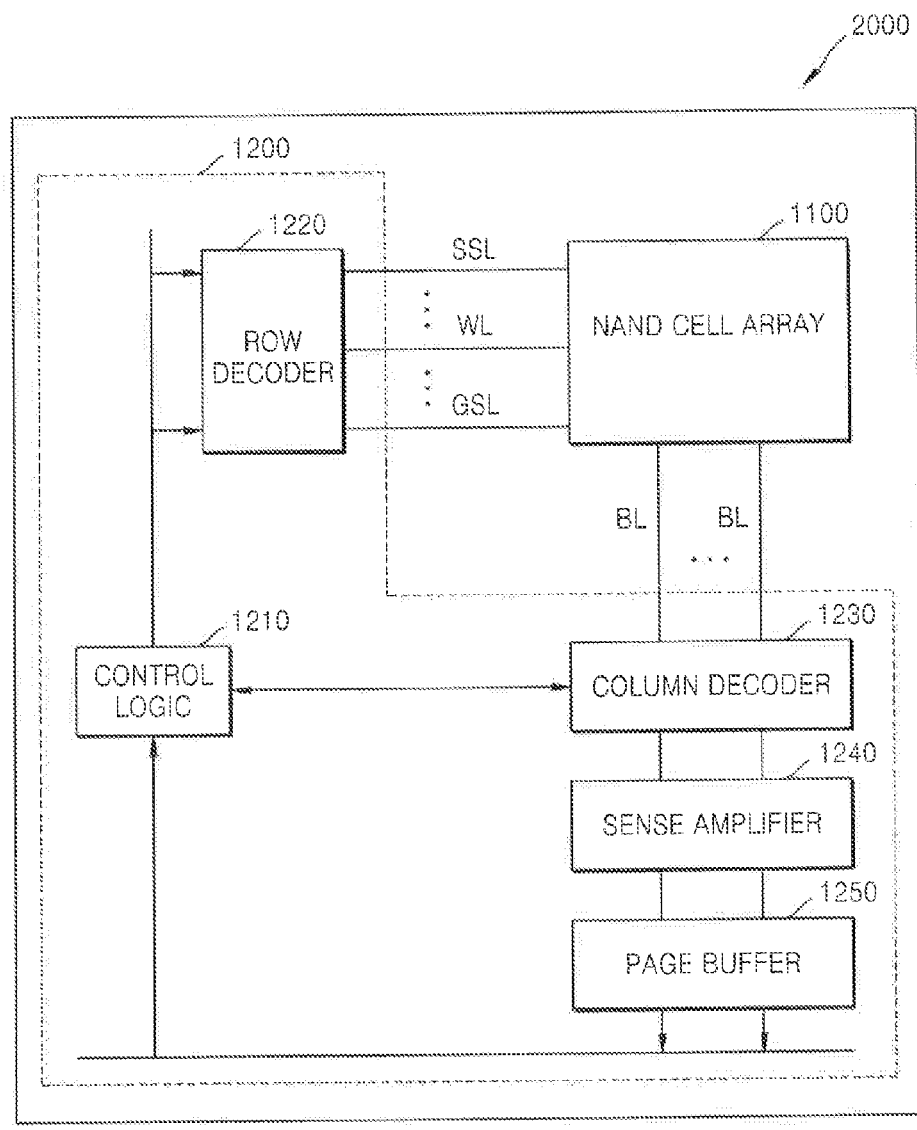
FIG. 10 is a block diagram of a non-volatile memory device according to an exemplary embodiment of the present inventive concept.

FIG. 10 is a block diagram of a non-volatile memory device 2000 according to an exemplary embodiment of the present inventive concept.

Referring to FIG. 10, the non-volatile memory device 2000 includes a NAND cell array 1100, and a core circuit unit 1200. For example, the NAND cell array 1100 includes a vertically structured semiconductor device according to an exemplary embodiment. The core circuit unit 1200 includes a control logic 1210, a row decoder 1220, a column decoder 1230, a sense amplifier 1240, and a page buffer 1250.

The control logic 1210 communicates with the row decoder 1220, the column decoder 1230, and the page buffer 1250. The row decoder 1220 communicates with the NAND cell array 1100 through a plurality of string selection lines SSL, a plurality of word lines WL, and a plurality of ground selection lines GSL. The column decoder 1230 communicates with the NAND cell array 1100 through a plurality of bit lines BL. The sense amplifier 1240 is connected to the column decoder 1230 when a data signal is outputted from the NAND cell array 1100, and when a data signal is transmitted to the NAND cell array 1100, the sense amplifier 1240 need not be connected to the column decoder 1230.

For example, the control logic 1210 transmits a row address signal to the row decoder 1220, and the row decoder 1220 transmits the row address signal to the NAND cell array 1100 through the string selection lines SSL, the word lines WL, and the ground selection lines GSL after decoding the row address signal. The control logic 1210 transmits a column address signal to the column decoder 1230 or to the page buffer 1250, and the column decoder 1230 transmits the column address signal to the NAND cell array 1100 through the bit lines BL after decoding the column address signal. A signal of the NAND cell array 1100 is transmitted to the sense amplifier 1240, and the signal is amplified and transmitted to the control logic 1210 through the page buffer 1250.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device comprising:
   a substrate;
   a channel layer formed on the substrate and extended in a first direction substantially perpendicular to an upper surface of the substrate;
   a ground selection line formed on a first region of the channel layer;
   a plurality of word lines formed on a second region of the channel layer; and
   a plurality of string selection lines formed on a third region of the channel layer,
   wherein the second region of the channel layer comprises a first conductivity type dopant,
   wherein the first, second and third regions of the channel layer are disposed along the first direction, and
   wherein the third region of the channel layer comprises a second conductivity type dopant.

2. The semiconductor device of claim 1,
   wherein a sidewall of the second region of the channel region is aligned with a sidewall of the third region of the channel region.

3. The semiconductor device of claim 1,
   wherein the first region of the channel contact region comprises a second conductivity type dopant.

4. The semiconductor device of claim 1,
   wherein the first region of the channel region comprises a first type conductivity type dopant, and
   wherein the first region of the channel region is in contact with the substrate.

5. The semiconductor device of claim 1,
   wherein the third region of the channel region comprises an n-type dopant.

6. The semiconductor device of claim 5,
   wherein the string selection line comprises at least two string selection lines.

7. The semiconductor device of claim 1,
   wherein the first conductivity type dopant is an n-type dopant including phosphorus, arsenic, or antimony.

8. The semiconductor device of claim 1,
   wherein the channel layer has an n-type dopant concentration in a range from about 5E16 atoms/cm$^3$ to about 1E19 atoms/cm$^3$.

9. A semiconductor device comprising:
   a substrate;
   a ground selection transistor stacked on the substrate;
      a plurality of memory cell transistors stacked on the ground selection transistor,
      wherein the plurality of memory cell transistors is stacked on each other in a first direction,
      wherein the first direction is substantially perpendicular to the substrate, wherein a lowermost memory cell transistor of the plurality of memory cell transistors is stacked on the ground selection transistor,
      wherein the plurality of memory cell transistors comprises a first channel layer doped with a first impurity type dopant and extended in the first direction;
   a string selection transistor stacked on an uppermost memory cell transistor of the plurality of memory cell transistors;
   a drain electrode stacked on the string selection transistor in the first direction; and
   a source region formed on the substrate, wherein the source region is spaced apart from the plurality of memory cell transistors in a second direction substantially perpendicular to the first direction,
   wherein the string selection transistor comprises a second channel layer doped with a second conductivity type dopant and extended in the first direction.

10. The semiconductor device of claim 9,
    wherein the first impurity type dopant of the plurality of memory cell transistors is uniformly distributed in the first direction at a first concentration.

11. The semiconductor device of claim 9,
wherein the second conductivity type dopant is uniformly distributed at a second concentration.

12. The semiconductor device of claim 9, further comprising a lower dummy transistor and an upper dummy transistor, wherein the lower dummy transistor LDT is interposed between the ground selection transistor and the lowermost memory cell transistor, wherein the upper dummy transistor is interposed between the uppermost memory cell transistor and the string selection transistors.

13. The semiconductor device of claim 9,
wherein the ground selection transistor comprises a third channel layer doped with a second conductivity type dopant,
wherein the first and second channel layers form an U-shaped channel layer, wherein a closed lower end of the U-shaped channel is in contact with the third channel layer.

14. The semiconductor device of claim 9,
wherein the ground selection transistor comprises a third channel layer doped with a first conductivity type dopant,
wherein the first, second and third channel layers form an U-shaped channel layer, wherein a closed lower end of the U-shaped channel is in contact with the substrate.

* * * * *